(12) United States Patent
Nozuyama

(10) Patent No.: US 7,082,559 B2
(45) Date of Patent: Jul. 25, 2006

(54) SEMICONDUCTOR INTEGRATED CIRCUIT DEVICE AND TEST METHOD THEREOF

(75) Inventor: Yasuyuki Nozuyama, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 428 days.

(21) Appl. No.: 10/091,552

(22) Filed: Mar. 7, 2002

(65) Prior Publication Data

US 2002/0176288 A1    Nov. 28, 2002

(30) Foreign Application Priority Data

Mar. 7, 2001    (JP)    ............... 2001-063725

(51) Int. Cl.
*G01R 31/28*    (2006.01)
(52) U.S. Cl. ..................... 714/726; 714/732
(58) Field of Classification Search ............... 714/726, 714/732
See application file for complete search history.

(56) References Cited

U.S. PATENT DOCUMENTS

| | | | |
|---|---|---|---|
| 4,377,757 A | | 3/1983 | Könemann et al. |
| 5,184,067 A | | 2/1993 | Nozuyama |
| 5,488,615 A | * | 1/1996 | Kunoff et al. ............... 714/732 |
| 5,677,916 A | | 10/1997 | Nozuyama |
| 5,680,543 A | * | 10/1997 | Bhawmik ..................... 714/30 |
| 5,805,608 A | * | 9/1998 | Baeg et al. ................... 714/726 |
| 5,841,867 A | * | 11/1998 | Jacobson et al. ............ 713/187 |
| 5,867,409 A | | 2/1999 | Nozuyama |
| 5,872,794 A | * | 2/1999 | Cook et al. .................. 714/732 |
| 6,223,312 B1 | | 4/2001 | Nozuyama |
| 6,327,685 B1 | * | 12/2001 | Koprowski et al. ......... 714/733 |
| 6,684,358 B1 | * | 1/2004 | Rajski et al. ................ 714/739 |

FOREIGN PATENT DOCUMENTS

| | | |
|---|---|---|
| JP | 64-80885 | 3/1989 |
| JP | 2-47574 | 2/1990 |
| JP | 6-43214 | 2/1994 |
| JP | 8-5711 | 1/1996 |
| JP | 2000-137061 | 5/2000 |
| JP | 2000-352576 | 12/2000 |

OTHER PUBLICATIONS

Yasuyuki Nozuyama, "Semiconductor Integrated Circuit Including A Test Facilitation Circuit For Functional Blocks Intellectual Properties And Automatic Insertion Method Of The Same Test Facilitation Circuit" U.S. Appl. No. 09/960,414, filed Sep. 24, 2001.

Notification of Reasons for Rejection issued by Japanese Patent Office mailed Apr. 25, 2006, in Japanese Application No. 2001-063725 and English translation of Notice.

* cited by examiner

*Primary Examiner*—Joseph Torres
(74) *Attorney, Agent, or Firm*—Finnegan, Henderson, Farabow, Garrett & Dunner, L.L.P.

(57) ABSTRACT

A semiconductor integrated circuit device includes a test target circuit, a control circuit, and an observation circuit. The control circuit generates a reset signal, and an operation mode signal. The observation circuit is controlled by the signals, and receives input data from observation points in the test target circuit. The observation circuit includes a plurality of flip-flops. The observation circuit performs a reset operation in response to the reset signal. The observation circuit selectively performs a signature-compression operation, and a serial operation of outputting the test result, in response to the operation mode signal. The signature-compression operation is performed, using input data generated in the test target circuit in accordance with test patterns for a normal functional operation.

11 Claims, 14 Drawing Sheets

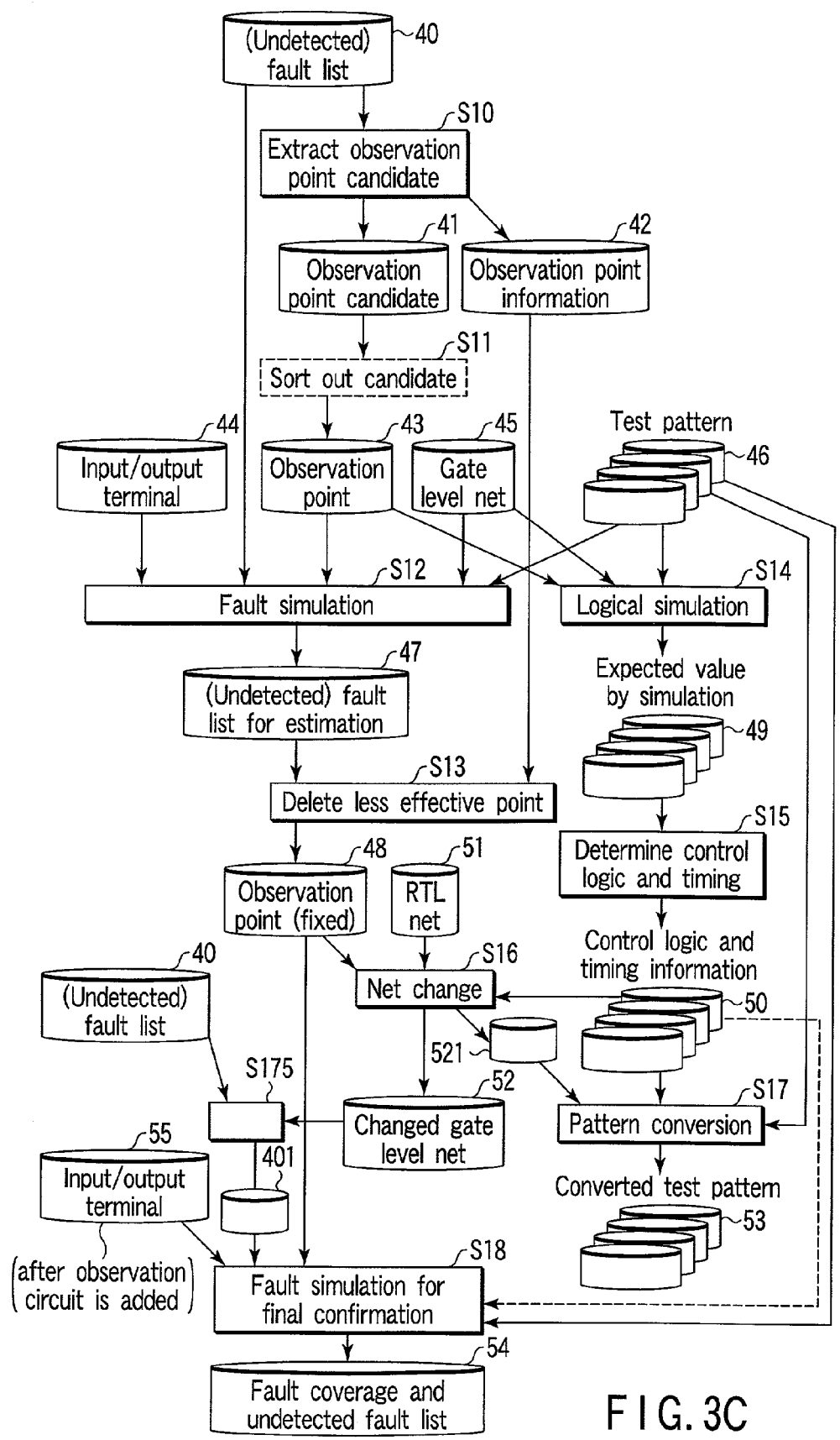
F I G. 3C

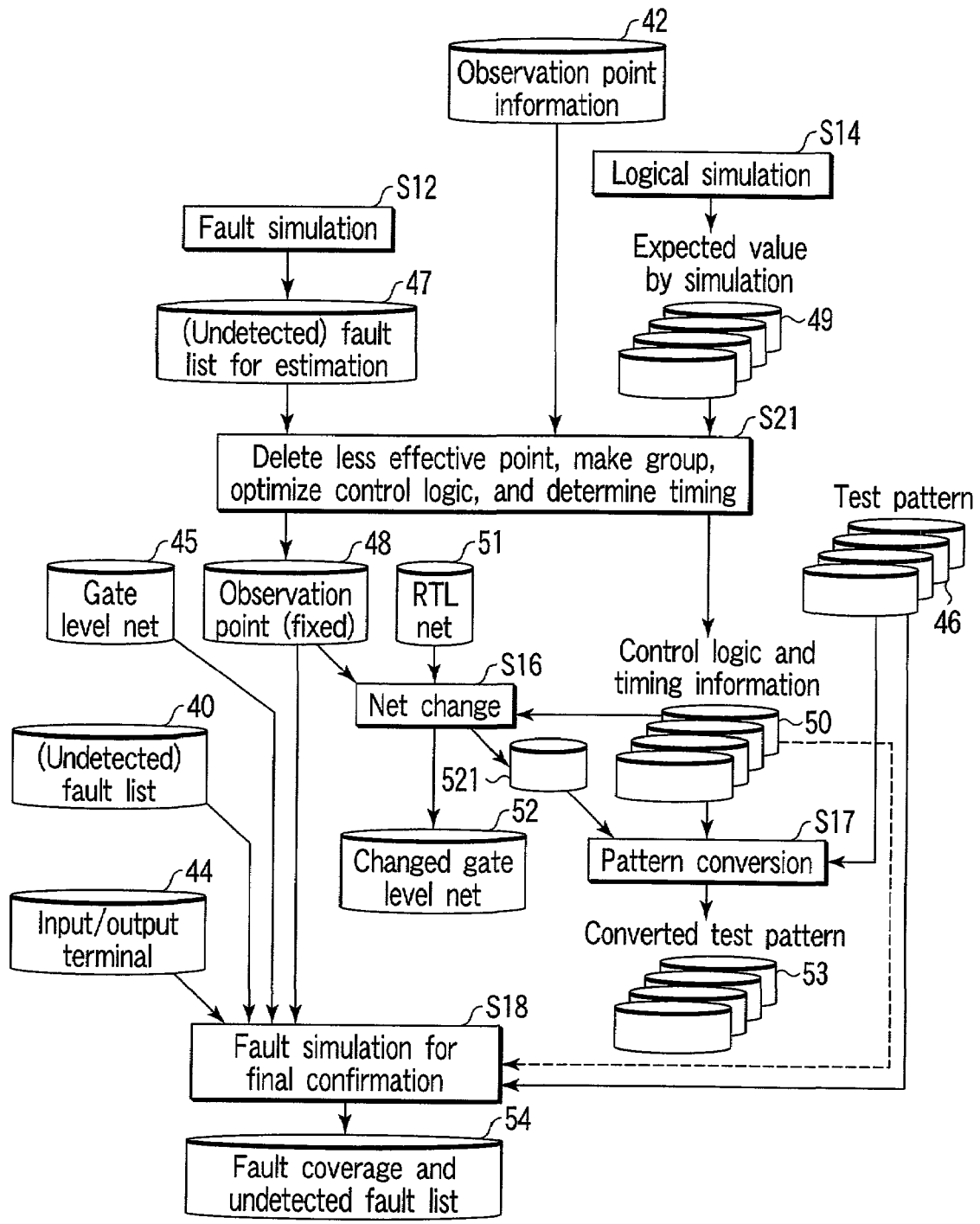
F I G. 14A

SEMICONDUCTOR INTEGRATED CIRCUIT DEVICE AND TEST METHOD THEREOF

CROSS-REFERENCE TO RELATED APPLICATIONS

This application is based upon and claims the benefit of priority from the prior Japanese Patent Application No. 2001-063725, filed Mar. 7, 2001, the entire contents of which are incorporated herein by reference.

BACKGROUND OF THE INVENTION

1. Field of the Invention

The present invention relates to a semiconductor integrated circuit (IC) device and a test method thereof, and particularly to a fault detection technique for a semiconductor IC device.

2. Description of the Related Art

In general, test patterns for normal (ordinary) operations are manually generated with the aim of function verification, and are also used for shipping tests in mass production of LSI (Large Scale Integrated circuit) products, such as microcomputers. In order to improve the fault coverage (detection rate of faults), this method may proceed with the following procedures. First, a fault simulation is performed on a target LSI, using test patterns, and a non-detected fault list obtained thereby is checked. Then, test patterns, which seem to allow non-detected faults to be detected, are added, and a fault simulation is performed again to confirm effects of the test patterns.

This method is the lowest in area cost, because there is no need to add any test circuit. In addition, this method easily achieves a relatively high fault coverage (about 85% to 92%). However, with this method, it is very difficult, using only test patterns from the outside, to completely detect non-detected faults of logics deep in an LSI or non-detected faults that are hardly detected by setting a test environment of an LSI. Consequently, it is necessary to take great effort to achieve a high fault coverage of, e.g., 95% or more, which is required for LSI products in recent years. This method also entails another problem in that it cannot necessarily guarantee to reach a target value.

On the other hand, a design for testability (test facilitating design) on the basis of full scan design, which is used for large-scale system LSI products, easily provides test patterns achieving a fault coverage of 95% or more by an ATPG (Automatic Test Pattern Generation) tool. However, this design method requires almost all the internal flip-flops and latches to be scannable (a circuit structure that can be scan-operable), which may give rise to an increase in area of from 5% to 20%. For this reason, this design method is not necessarily a satisfactory solution for microcomputer products or the like, which are manufactured in a very high volume over a long period of time and suffer severe cost competition.

FIG. 17A is a block diagram schematically showing the internal structure of a conventional semiconductor integrated circuit device (LSI). As shown in FIG. 17A, a combinational logic (random logic) 200, and flip-flops 210-1 to 210-4 used as memory elements of an LSI 100 are arranged in the LSI 100.

FIG. 17B is a block diagram schematically showing the internal structure of a conventional semiconductor IC device, formed by modifying the structure shown in FIG. 17A with a basic scan design method, in which a clock for scanning is common to the system clock. An explanation will be given of the basic scan design method with reference to FIG. 17B.

As shown in FIG. 17B, multiplexers 220-1 to 220-4 to be controlled by a test mode signal TEST are disposed immediately before the inputs D of the flip-flops 210-1 to 210-4, respectively. The multiplexer 220-1 at the first stage receives as inputs a test pattern inputted from a scan-in terminal SI, and an output of the combinational logic 200. These inputs are subjected to a selection operation by the multiplexer 220-1 on the basis of the TEST signal, so that the selected one is inputted into the flip-flop 210-1. The multiplexer 220-2 at the next stage receives as inputs the output Q of the flip-flop 210-1 and an output of the combinational logic 200. These inputs are subjected to a selection operation by the multiplexer 220-2 on the basis of the TEST signal, so that the selected one is inputted into the flip-flop 210-2. A similar arrangement is formed for each of the flip-flops 210-3 and 210-4 at the following stages. The output of the flip-flop 210-4 at the final stage comes to a scan-out terminal SO.

In the device described above, when TEST=0, a normal (ordinary) operation is performed. Specifically, outputs of the combinational logic 200 in the ordinary operation are respectively stored in the flip-flops 210-1 to 210-4 in synchronism with a clock. When TEST=1, a scanning operation is performed. Specifically, all the flip-flops 210-1 to 210-4 operate as a shift register, using the scan-in terminal SI as the input, and the scan-out terminal SO as the output. Accordingly, arbitral test data can be serially inputted from the outside of the LSI 100 into the flip-flops 210-1 to 210-4. Furthermore, these contents can be read out of the LSI 100 (scan-operable).

The scanning test is performed by repeating the following two steps.

(1) When TEST=1, setting of the necessary test data, and readout of a test result are serially performed.

(2) When TEST=0, a test result in a normal operation is stored in the respective flip-flops.

As described above, with this scan design method, flip-flops and latches in an LSI can be treated imaginarily equivalently to input and output terminals of the LSI. Accordingly, a test pattern generating algorithm on a combinational circuit can be applied to this test pattern generation, thereby, at present, allowing a high fault coverage to be relatively easily obtained, using a commercially available ATPG tool. However, as mentioned above, the scan design method requires almost all the internal flip-flops and latches to be scannable in order to reliably obtain a high fault coverage. This brings about a problem of a remarkable increase in area. Furthermore, depending on the method of implementation, such as adding multiplexers or the like, as shown in FIG. 17, the performance (e.g., operation frequency) in the normal operations may be lowered.

On the other hand, there is a method of adding observation points to improve a fault coverage on a test target LSI. The simplest method is to lead a node to be observed to an output terminal of an LSI, and to directly observe it when a test is executed. However, this method cannot be a practical solution, because the number of terminals increases with an increase in the number of observation points. As a countermeasure against this problem, there is a proposal to input the data from observation points into an exclusive OR (XOR) gate, and to observe only its output. In this case, however, it is difficult to analyze a generated fault at one of the observation points. Furthermore, where an even number of the observation points output at the same time a logical value, which is not correct due to a fault in an LSI, the output of an XOR gate becomes the same as the normal state, thereby preventing the fault from being detected (fault masking). Accordingly, not allowing a number of observation points to be put together, this method cannot essentially solve the problem described above in which the number of terminals of an LSI increases with an increase in the number of observation points.

In light of the problems described above, where an LSI includes a number of observation points therein, a parallel-input signature-compression (compressing pieces of applied test data to generate own signatures corresponding to the pieces of test data) register is used in general as a conventional method to prevent the number of terminals of the LSI from increasing. This method is utilized in the manner of, e.g., arranging an observation register in a microprocessor or the like. FIG. 18 is a circuit diagram showing a conventional observation circuit in a semiconductor IC device for this method. FIG. 18 shows a basic structure including a part other than signature-compression (four bit width). This is almost the same as that of a circuit known as BILBO (Built-In Logic Block Observer).

As shown in FIG. 18, this device includes four flip-flops 210-5 to 210-8 operated by a clock CLK. The output of the flip-flop 210-7 at the third stage and the output of the flip-flop 210-8 at the fourth stage are subjected to an exclusive OR operation by an XOR gate 230-1. This operation result and a test pattern from a scan-in terminal SI are subjected to a selection operation by a multiplexer 240 on the basis of a signal A. The scan-in terminal SI is an input terminal of an LSI 100, for example.

Where respective signals observed at observation points are named signals D[0] to D[3], the respective signals D[0] to D[3] and the signal A are subjected to an AND operation by AND gates 250-1 to 250-4. A signal selected by the multiplexer 240 and the signal B are subjected to an AND operation by an AND gate 250-5. This operation result and the output of the AND gate 250-1 are subjected to an exclusive OR operation by an XOR gate 230-2. This operation result comes to the input D of the flip-flop 210-5. The output Q of the flip-flop 210-5 and the signal B are subjected to an AND operation by an AND gate 250-6. This operation result and the output of the AND gate 250-2 are subjected to an exclusive OR operation by an XOR gate 230-3. This operation result comes to the input D of the flip-flop 210-6.

Then, similarly, the respective outputs Q of the flip-flops 210-6 and 210-7 and the signal B are subjected to an AND operation by AND gates 250-7 and 250-8. These operation results and the outputs of AND gates 250-3 and 250-4 are subjected to an exclusive OR operation by XOR gates 230-4 and 230-5, respectively. These outputs come to the inputs D of the flip-flops 210-7 and 210-8 at the following stages, respectively. The output Q of the flip-flop 210-8 is outputted from a scan-out terminal SO through a buffer 260. The scan-out terminal SO is an output terminal of the LSI 100, for example. In general, the outputs Q[0] to Q[3] of the flip-flops 210-5 to 210-8 come to inputs of another circuit block in the LSI 100.

Operations of the circuit are controlled by the signals A and B, as shown in Table 1.

TABLE 1

| A | B | OPERATION |
|---|---|---|
| 0 | 0 | RESET ("0" INTO ALL FLIP-FLOPS) |
| 0 | 1 | SERIAL |
| 1 | 0 | TEST DATA CAPTURE (NORMAL) |
| 1 | 1 | SIGNATURE-COMPRESSION |

An explanation will be given of the operations, focusing on one bit (the flip-flop 210-6) shown in FIG. 18.

When A=0 and B=0, both the outputs of the AND gates 250-2 and 250-6 become "0", and the output of the XOR gate 230-3 also becomes "0". Accordingly, "0" is inputted into all the flip-flops including the flip-flop 210-6, thereby performing a reset operation.

When A=0 and B=1, the multiplexer 240 selects data inputted from the scan-in terminal SI. The output of the XOR gate 230-3 becomes the same as the output of the AND gate 250-6 (, which is equivalent to the output of the flip-flop 210-5). As a whole, the four flip-flops 210-5 to 210-8 are in a state of being connected in series, and perform a serial operation in synchronism with a clock.

When A=1 and B=0, a value the same as the D[1] is stored in the flip-flop 210-6. As a whole, they perform an operation of capturing the outputs of the observation points.

When A=1 and B=1, an exclusive OR between the D[1] and the output Q of the flip-flop 210-5 (one stage prior to the flip-flop 210-6) is stored in the flip-flop 210-6. At the same time, an exclusive OR between the output of the XOR gate 230-1 and the D[0] is stored in the flip-flop 210-5 at bit "0". Consequently, as a whole, they become a signature-compression register to perform a signature-compression operation. In this operation, on the basis of data in the flip-flop and the outputs newly applied from observation points, pseudo-random data is generated in the flip-flops. When the test is completed, data (a signature) peculiar to the sequence of the output data from the observation points is stored in the flip-flops as a test result.

The steps of the test are as follows. Specifically, A=0 and B=0 are first set to cause the contents of the flip-flop to be "0", before the first data to be observed is outputted. Then, A=1 and B=1 are set to perform signature-compression on all the effective output from the observation points. After the test is completed, A=0 and B=1 are set to cause the flip-flops, which are inside the signature-compression register, to perform a serial operation. Then, a test result is serially read out of the LSI, and is compared with an expected value for the normal circuit to judge whether there is a fault or not. There are various methods logically realized as a method of performing this readout, including the relationship relative to test mode signals.

When A=1 and B=0, the outputs from the observation points can be stored in the flip-flops, just as they are. Accordingly, fault diagnosis can be performed on the observation point in the LSI by the following method. Specifically, in arbitral one cycle of the normal operations, A=1 and B=0 are first set to store data from the observation points in a normal operation, and then A=0 and B=1 are set to serially output the stored data out of the LSI.

However, the conventional method of inserting observation points described above has been no more than a unsatisfactory method using an observation circuit to improve observation, thereby expecting an improvement in the fault coverage to some extent. In this method, observation points are arranged without clearly recognizing faults to be detected. Consequently, it is not satisfactory in terms of optimizing or minimizing circuits added for observation. Furthermore, this method pays no attention to the technique of determining a control system, sufficiently considering characteristics of test patterns applied to a test target LSI. Consequently, it may not improve the fault coverage up to the expectation, even though an observation circuit is added.

As described above, the conventional method of inserting observation points for fault detection and diagnosis on an LSI is performed without clearly recognizing faults to be detected. As a result, the area efficiency of the LSI is deteriorated, although the fault coverage is improved to some extent. Furthermore, the conventional method pays no attention to a technique of determining a control system sufficiently considering characteristics of test patterns. As a result, the effect of improving the fault coverage is not sufficient.

BRIEF SUMMARY OF THE INVENTION

According to a first aspect of the present invention, there is provided a semiconductor integrated circuit device comprising:

a test target circuit including a plurality of nodes and terminals;

a control circuit configured to generate an internal reset signal, and an internal operation mode signal, in response to an external clock signal or an internal clock signal generated from the external clock signal, an external reset signal, and an external operation mode signal inputted therein; and an observation circuit configured to receive an input of data from observation points, which are selected from the nodes and terminals corresponding to faults not detected by a test that causes the test target circuit to perform a substantially normal functional operation, the observation circuit comprising a plurality of flip-flops, wherein the observation circuit is controlled by the internal clock signal, the internal reset signal, and the internal operation mode signal, and is configured to reset the flip-flops in response to the internal reset signal, and to selectively perform a first operation of compressing the data from the observation points to generate a signature and a second operation of serially transferring data, using the flip-flops, in response to the internal operation mode signal, and wherein the first operation is performed, using input data generated in the test target circuit in accordance with test patterns that cause the test target circuit to perform a substantially normal functional operation, and the second operation is performed to cause the flip-flops to be connected in series, and to read the signature out of the observation circuit.

According to a second aspect of the present invention, there is provided a method of performing a test on a semiconductor integrated circuit device, which comprises a test target circuit including a plurality of nodes and terminals, the method comprising:

extracting from a first undetected fault list, in which faults not detected by a first fault simulation are listed, observation point candidates selected from the nodes and terminals, and observation point information including a type of each undetected fault at the observation point candidates;

sorting out the observation point candidates to obtain first observation points;

performing a second fault simulation to confirm an effect of inserting the first observation points, and obtain a second undetected fault list, by using the first observation points, circuit connection information at first gate level, and first test patterns; and deleting less effective part of the first observation points, in accordance with the second fault simulation to obtain second observation points.

BRIEF DESCRIPTION OF THE SEVERAL VIEWS OF THE DRAWING

FIG. 3C is a flowchart showing a method of determining observation points in a semiconductor IC device, according to a modification of the first embodiment;

FIG. 14A is a flowchart showing a method of determining observation points in a semiconductor IC device, according to a fourth or fifth embodiment of the present invention;

DETAILED DESCRIPTION OF THE INVENTION

Figure 1:
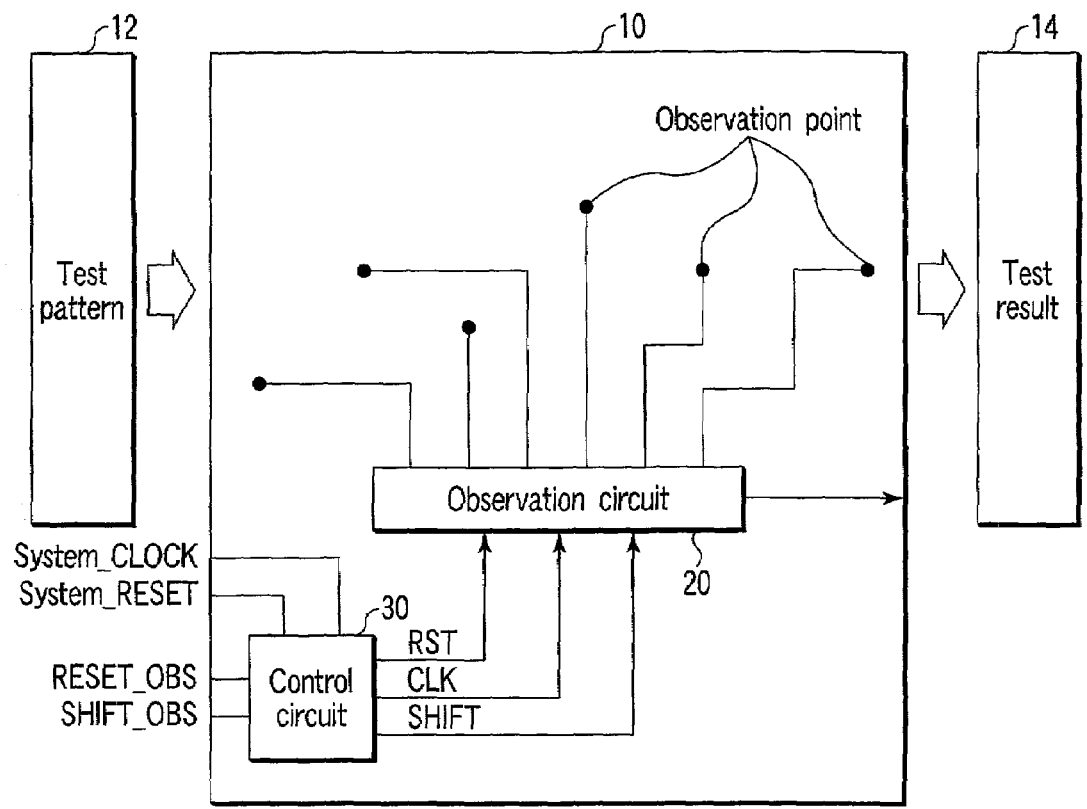
FIG. 1 is a block diagram showing a semiconductor IC device according to a first embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIRST EMBODIMENT

FIG. 1 is a block diagram showing a semiconductor IC device according to a first embodiment of the present invention. The block diagram shows the internal structure of an LSI, and particularly a circuit used for a test.

As shown in FIG. 1, a plurality of observation points for a test (indicated with black circular symbols) are determined in the LSI 10. The LSI 10 includes an observation circuit 20 to which test results from the observation points are inputted, and a control circuit 30 for controlling the observation circuit 20. The observation points are selected from nodes and terminals in a test target circuit in the LSI 10, such as a combinational logic, or a random logic including flip-flops, latches, and so forth. A System_CLOCK signal, a System_RESET signal, a RESET_OBS signal, and a SHIFT_OBS signal are inputted into the control circuit 30 from the outside of the LSI 10. Based on the signals, the control circuit 30 outputs a reset signal RST, a clock signal CLK, and a shift signal SHIFT. By the RST signal, the CLK signal, and the SHIFT signal, the observation circuit 20 is controlled. The CLK signal may be generated by another circuit (a clock generator). The observation circuit 20 is arranged not to affect the normal (ordinary) operations of the LSI 10.

When a test is performed, test patterns formed by compiling test patterns for normal operations are inputted into the LSI 10 from the input side 12 through an input terminal or an input/output terminal of the LSI 10. Data obtained from observation points upon input of a test pattern are compressed to a signature by the observation circuit 20. The output of the LSI 10 is read out to the output side 14 through an output terminal or an input/output terminal of the LSI 10, and is compared with an expected value for the test target circuit (the LSI 10) in a normal state, thereby judging whether there is a fault or not. The signature generated in the observation circuit 20 is read out to the output side 14 through an output terminal of the LSI 10 by activating the SHIFT signal under the control of the control circuit 30, and is compared with an expected value for the test target circuit (the LSI 10) in a normal state, thereby judging whether there is a fault or not.

Figure 2:
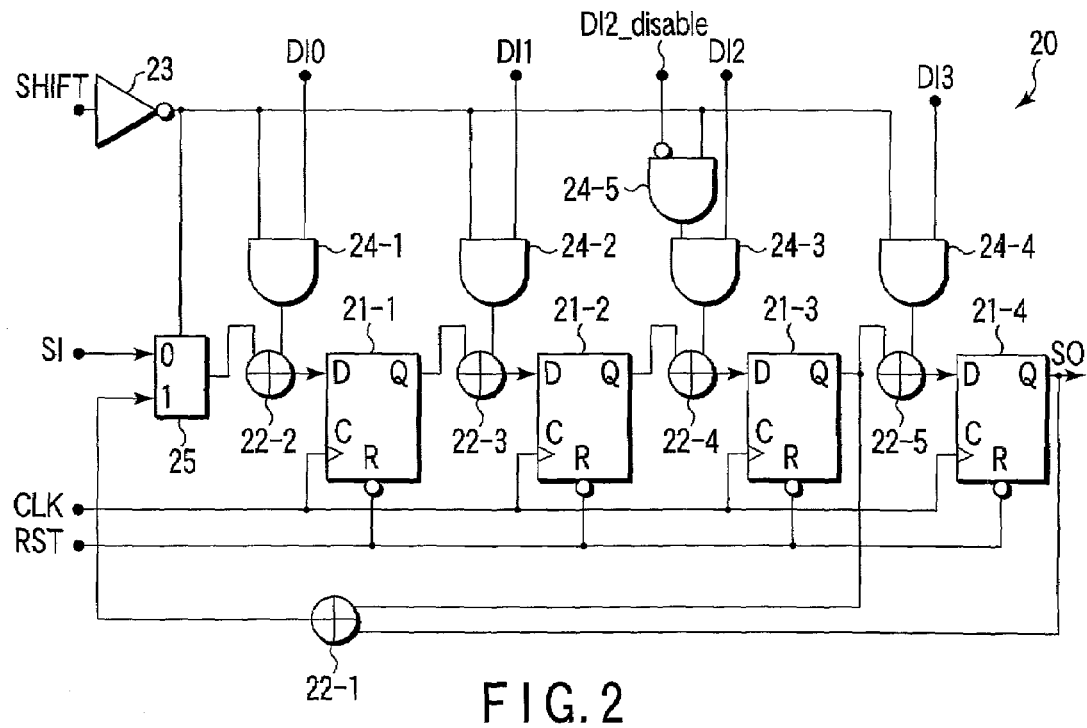
FIG. 2 is a circuit diagram showing an observation circuit of a semiconductor IC device according to the first embodiment.

FIG. 2 is a circuit diagram showing an observation circuit of a semiconductor IC device according to the first embodiment. This circuit diagram shows an example in which the observation circuit 20 is constituted with four bits.

As shown in FIG. 2, the observation circuit 20 includes four flip-flops 21-1 to 21-4 operated by the CLK signal and the RST signal. The output Q of the third-stage flip-flop 21-3 and the output Q of the fourth-stage flip-flop 21-4 are subjected to an exclusive OR operation by an XOR gate 22-1. This operation result and a test pattern inputted from a scan-in terminal SI are subjected to a selection operation by a multiplexer 25 on the basis of a shift signal SHIFT inverted by an inverter 23.

Where signals respectively observed at the observation points are named signals DI0 to DI3, the respective signals DI0, DI1, and DI3, and the shift signal SHIFT inverted by the inverter 23 are subjected to an AND operation by AND gates 24-1, 24-2, and 24-4. The inverted signal of a DI2_disable signal inputted from the outside, and the inverted signal of the SHIFT signal are subjected to an AND operation by an AND gate 24-5. This operation result and the signal DI2 are subjected to an AND operation by an AND gate 24-3. The DI2_disable signal will be described later in more detail.

A signal selected by the multiplexer 25 and the output of the AND gate 24-1 are subjected to an exclusive OR operation by an XOR gate 22-2. This operation result comes to the input D of the flip-flop 21-1. The output Q of the flip-flop 21-1 and the operation result from the AND gate 24-2 are subjected to an exclusive OR operation by an XOR gate 22-3. This operation result comes to the input D of the flip-flop 21-2. The output Q of the flip-flop 21-2 and the output of the AND gate 24-3 are subjected to an AND operation by an XOR gate 22-4. This operation result comes to the input D of the flip-flop 21-3. The output Q of the flip-flop 21-3 is inputted into the XOR gate 22-1. The output Q of the flip-flop 21-3 and the output of the AND gate 24-4 are subjected to an AND operation by the XOR gate 22-5. This operation result comes to the input D of the flip-flop 21-4. The output Q of the flip-flop 21-4 is a scan-out signal SO and is also inputted into the XOR gate 22-1, as described above.

The observation circuit 20 is controlled by inputs from the control circuit 30. Specifically, as shown in Table 2, it is reset by an asynchronous reset signal RST, and performs a shift operation by a shift signal SHIFT.

TABLE 2

| RST | SHIFT | OPERATION |
|-----|-------|-----------|
| 0   | —     | RESET     |
| 1   | 0     | SIGNATURE-COMPRESSION |
| 1   | 1     | SHIFT     |

The values of the observation points are captured as follows. Specifically, the observation circuit 20 is reset in a cycle just before the cycle for which the capture is necessary. Then, the data of one cycle is subjected to a signature-compression operation (i.e., compressing the data to a signature). Then, a serial operation is performed. The observation circuit 20 realizes its main function with an operation as a signature-compression register. It should be noted that there is an "aliasing" probability of $1/2^n$ (n is the number of flip-flops), in which the final test result becomes the same as that of a normal operation, in spite of the fact that there is a fault in a test target, i.e., the LSI 10, and thus an output different from that of the correct normal operation is outputted from some observation point. Accordingly, in practice, where the number of observation points is small, it is preferable to satisfy, for example, n>20, at least. Furthermore, in general, an optimum feedback circuit (bit positions to be fed back) varies depending on the number of bits of a signature-compression register; which requires some consideration.

As described above, the RESET_OBS signal and the SHIFT_OBS signal, as well as the System_RESET signal and the System_CLOCK signal, are inputted into the control circuit 30, other than signals for normal operations of the LSI 10. In return, the control circuit 30 outputs the RST signal, the SHIFT signal, and the CLK signal for controlling the observation circuit 20. The CLK signal may be generated elsewhere in the LSI 10.

Figure 3A:
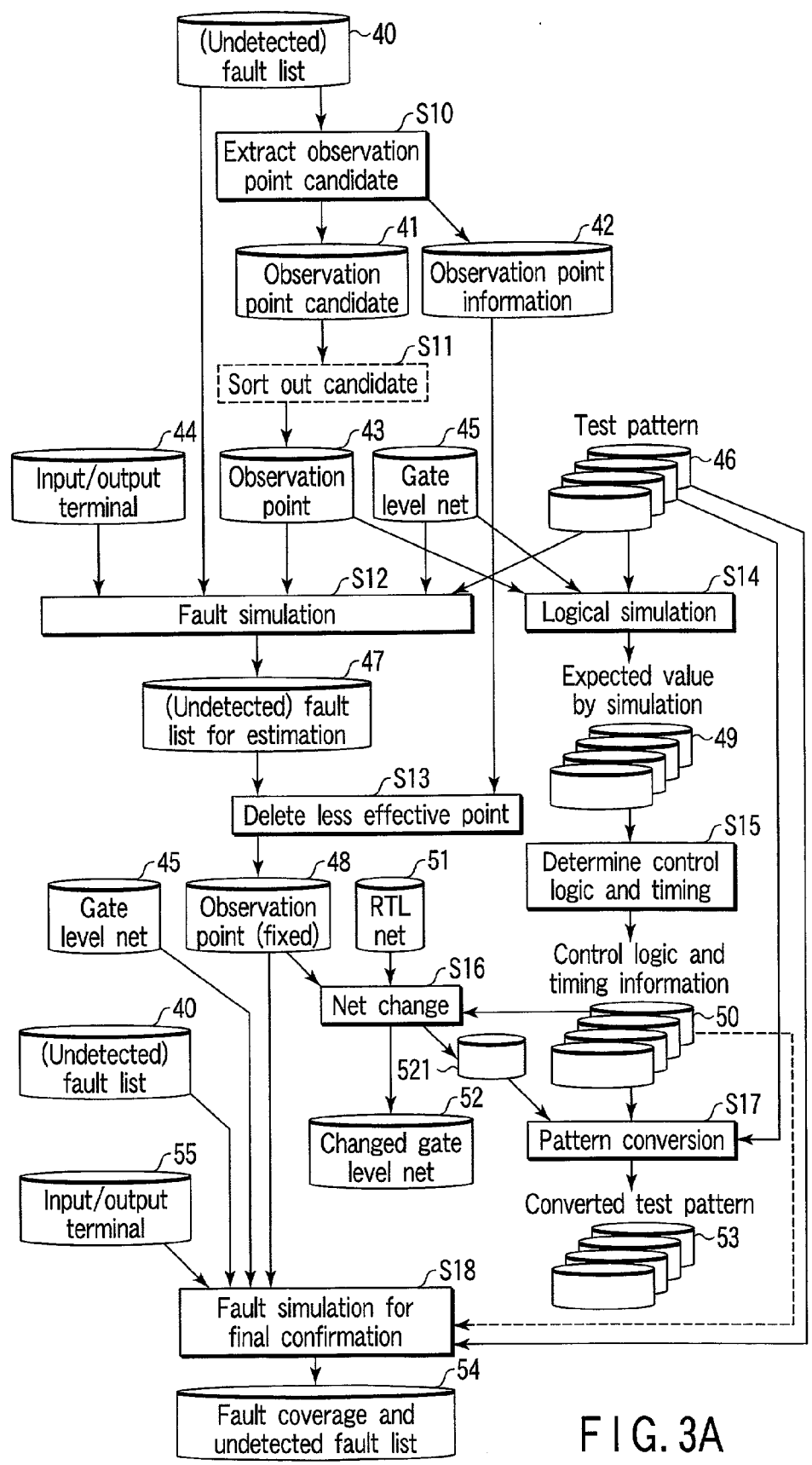
FIG. 3A is a flowchart showing a method of determining observation points in a semiconductor IC device, according to the first embodiment.

FIG. 3A is a flowchart showing a method of determining observation points in a semiconductor IC device, according to the first embodiment. In principle, each observation point is determined in accordance with the process flow shown in FIG. 3A, to correspond to faults, which have not been detected by a test using test patterns for normal operations. An explanation will be given of a flow for determining observation points with reference to FIG. 3A.

An undetected fault list 40 (a first undetected fault list) includes a list of faults, which have not been detected by a fault simulation (a first fault simulation) using test patterns for normal operations of the LSI 10. Observation point candidates, which seem to be effective as observation points, are extracted by an observation point candidate extraction tool (program) from those nodes in the LSI 10 that correspond to the undetected faults included in the undetected fault list 40 (step S10), so that observation point candidates 41 are obtained. The undetected fault list 40 may be a list of undetected faults, which is obtained by applying a scan design of a BIST (Built In Self Test) to a part in the LSI 10, thereby performing a fault simulation using test patterns for normal operations on the undetected faults.

The extraction tool also outputs observation point information 42, such that, for example, undetected faults corresponding to nodes extracted as observation points are stuck-at-zero, stuck-at-one, or either of them (step S10). Observation point candidates are selected from those that can be recognized with node names on an RTL (Register Transfer Level) net. An RTL net is the connection information of a circuit network (a circuit connection information at a function level) obtained by a logical description at a register transfer level. Where the number of this kind of nodes is large, selection priority is put on those having a larger number of equivalent faults.

An explanation will be given of the reason why observation point candidates are selected from those that can be recognized with node names on an RTL net. Almost all the actual LSI designs in recent years start with forming an RTL net, which describes LSI functions in RTL description. Then, test patterns for functional verification are generated (mainly manually) to perform design verification. After confirming predetermined functional operations, the RTL net is converted into data of a gate level net by a logical synthesis tool. A gate level net is the connection information of a circuit network obtained by logical description at a gate level. A fault simulation is performed relative to the data of a gate level net.

In order to omit unnecessary steps for the logical synthesis upon reuse, the logical synthesis tool may form an intermediate gate level net which is not optimized in terms of timing or the like. As regards reuse, which is a key point in future system LSI development, it is thought that, in almost all the cases, an LSI net is provided as an RTL net (with information on constraints on optimization of synthesis and timing), or an intermediate gate level net (with information on constraints on optimization of timing). In this case, a gate level net includes nodes with names corresponding to RTL net names, and nodes with arbitrary names given by a logical synthesis tool. The names of the latter nodes may not be maintained when a logical synthesis is performed again, or another optimization is performed, thereby bringing about a fear of an observation point setting result once used being unusable.

Setting of observation points requires sufficient consideration in such situations. According to this embodiment, nodes selected as observation points correspond not only to undetected faults, but also to those recognizable with RTL net names. These nodes recognizable with RTL net names are replaced with Q outputs or $\overline{Q}$ outputs of basic cells, such as flip-flops and latches, by a logical synthesis tool. However, it may be preferable that D inputs or the like of replacing flip-flops and latches are selected as observation points, on the basis of information, in order to improve observation. The term, "nodes recognizable with RTL net names", includes such nodes, which can be indirectly extracted from RTL net names.

In recent years, there is a case where a fault simulation is performed, while assuming faults (pin faults) at input/output terminals of basic cells in an LSI, in order to further improve the quality. In this case, since node names on an RTL net may not be clearly decided from faults themselves, it may be necessary to use a tool to engage pin names with net names.

In step S10, the content of the observation point candidates 41 selected by the extraction tool is further checked by the designer. At this time, candidates, which seem to be less effective in practice, are deleted, so that observation points 43 (first observation points) to be confirmed by a fault simulation are determined (step S11). An example of a candidate, which seems to be less effective, is one of the selected nodes connected to a specific register, where one node is connected to a data input and another to a data output. In this case, it is not clear which one is less effective, but it is necessary to confirm them with fault simulations, deleting either one in each simulation.

As described above, selected observation points 43, and output terminals and input/output terminals in output state among the input/output terminals 44 of the LSI 10 are assigned as detection points for the faults. Then, using a gate level net 45 of the LSI 10 (a circuit connection information at a first gate level), and test patterns 46 for normal operations (first test patterns), a fault simulation (a second fault simulation) is performed (step S12). By doing so, an undetected fault list 47 (a second undetected fault list) is formed. The fault list 47 is used basically for estimating effects of inserting observation points. Then, the fault list 47 and the observation point information 42 are inputted into a tool (program) for deleting less effective points. With this tool, those having no additional fault detection effects, such as a node, which corresponds to a stuck-at-zero undetected fault and is selected as an observation point, but it detects nothing, are deleted from the observation points (step S13). By doing so, final observation points 48 (second observation points) are obtained.

In order to finally obtain an accurate fault coverage, it is necessary to determine timing when the observation circuit is initialized. According to this embodiment, test patterns for normal operations are utilized. Generally, test patterns for normal operations are formed of a number of test patterns, which respectively test specific regions in the LSI 10. With several test patterns, some of the observation points are not initialized. Furthermore, as regards each test pattern, some of the observation points make a settled value immediately before and after system reset of the LSI 10, and other of the observation points make a settled value only by a few specific test patterns after the system reset. Examples of this kind are shown in Table 3. Table 3 shows the result of monitoring change of values at observation points P1 to P7, when a logical simulation was performed on the LSI 10 with a specific test pattern. In Table 3, T1 to T10 denote simulation time.

TABLE 3

| Time | System_RESET | P1 | P2 | P3 | P4 | P5 | P6 | P7 |
|---|---|---|---|---|---|---|---|---|
| T1  | 0 | x | 0 | x | x | x | x | x |
| T2  | 0 | x | 0 | x | x | x | x | x |
| T3  | 1 | 1 | 0 | 0 | x | x | x | x |
| T4  | 1 | 1 | 1 | 0 | x | 1 | x | x |
| T5  | 1 | 1 | 1 | 0 | x | 1 | x | x |
| T6  | 1 | 0 | 0 | 1 | x | 1 | x | x |
| T7  | 1 | 0 | 0 | 1 | x | 0 | x | x |
| T8  | 1 | 0 | 1 | 1 | x | 0 | 1 | 0 |
| T9  | 1 | 1 | 1 | 0 | x | 1 | 1 | 0 |
| T10 | 1 | 1 | 1 | 0 | 0 | 1 | 0 | 0 |

As shown in Table 3, P1, P2, P3, and P5 basically make a settled value relatively soon after the system reset. On the other hand, P4, P6, and P7 take time to make a settled value after the system reset. Particularly, P4 is unsettled for a long time after the system reset. In order to maximize effects of inserting observation points (to improve the fault coverage), P1, P2, P3, and P5 preferably belong to one group, while P4, P6, and P7 to another group. The groups are respectively connected to inputs of different observation circuits, which can be independently reset (which will be described as a second embodiment). In practice, these logical simulation outputs are checked for all the test patterns, so that the observation points are divided into groups in light of reset logic.

Reset signals are respectively allocated to the groups of the observation points thus formed. The reset signals are controlled such that they are active at a predetermined timing for every test pattern. This control logic can be formed with a necessary and sufficient (suitable) scale by the following method. Specifically, times at which the reset signals should become effective for each test pattern are obtained, and are superposed for all the test patterns. Then, the control logic is formed including the determination of actual reset logic on the basis of information on the superposition of times at which reset signals should become effective.

Part of the flow shown in FIG. 3A described above corresponds to step S14 and step S15. Specifically, in step S14, using the observation points 43, the gate level net 45 of the LSI 10, and the test patterns 46, a logical simulation is performed. Then, in step S15, information 50 on the structures of the observation circuit and the control logic, and the control timing for the test patterns is obtained, on the basis of expected values 49, using a support tool for determining the observation circuit, the control logic, and the timing. According to this embodiment, the observation circuit includes the connection information of the observation points relative to specific input terminals of the observation circuit. However, the structure information 50 on the observation circuit and the control logic may not include such detailed information, but it may be determined when the net is changed in step S16. The control timing information 50 includes, for example, information as to what cycles are used to input the reset signals.

Figure 4A:
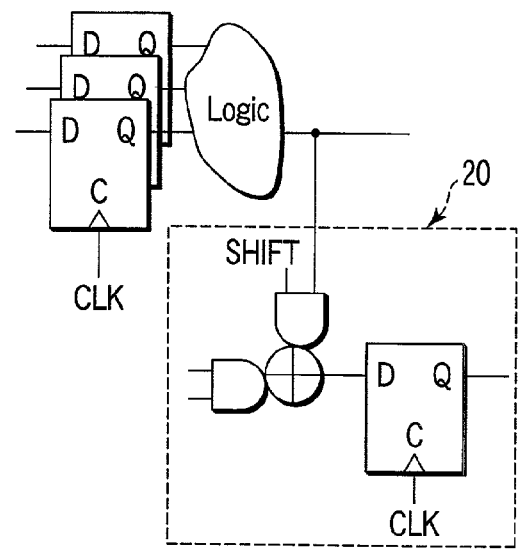
FIG. 4A is a block diagram showing part of an observation target and an observation circuit, according to the first embodiment.
Figure 4B:
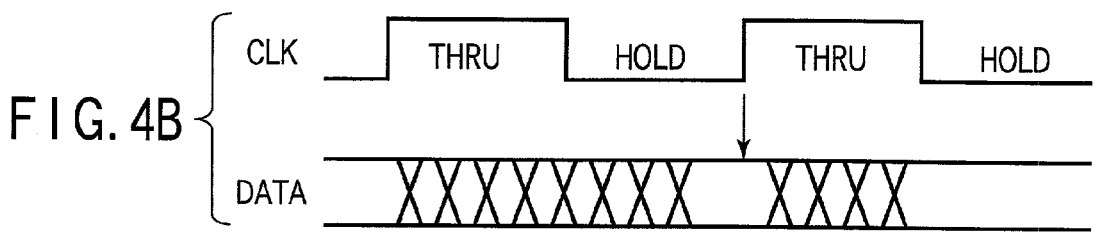
FIG. 4B is a timing chart showing a clock and data, in the case where the output of an observation point comes from a latch output through a combinational logic in the structure shown in FIG. 4A.
Figure 4C:
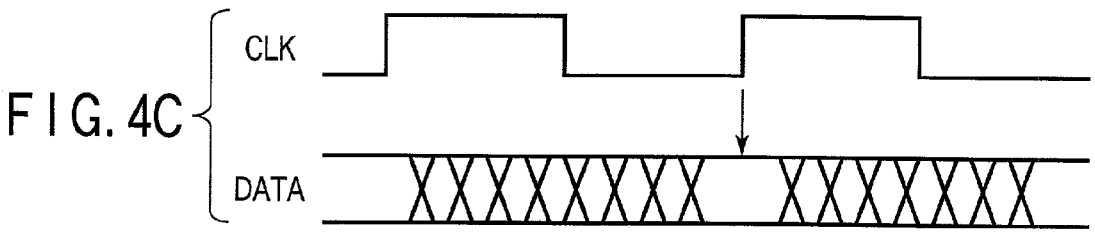
FIG. 4C is a timing chart showing a clock and data, in the case where the output of an observation point comes from a flip-flop output through a combinational logic in the structure shown in FIG. 4A.

The timing relationship between the observation points and the observation circuit is designed, as shown in FIGS. 4A to 4C, for example. FIG. 4A is a block diagram showing part of the observation target and the observation circuit, according to the first embodiment. In FIG. 4A, CLK denotes the system clock. FIG. 4B is a timing chart showing a clock and data, in the case where the output of an observation point comes from a latch output through the combinational logic in the structure shown in FIG. 4A. FIG. 4C is a timing chart showing a clock and data, in the case where the output of an observation point comes from a flip-flop output through the combinational logic in the structure shown in FIG. 4A.

As shown in FIG. 4B, where the output of an observation point comes from a latch output through the combinational logic, the output is captured at an edge of the clock at which the latch changes from Hold to Through. As shown in FIG. 4C, where the output of an observation point comes from a flip-flop output through the combinational logic, the output is captured at an edge of the clock at which the output of the flip-flop is renewed.

According to this embodiment, the observation circuit is arranged to hardly impose an ill effect, such as a delay increase, on the logic for normal operations. However, when the layout of the observation points is implemented in practice, it is necessary to sufficiently pay attention to a Hold Time violation in data transfer from the observation points to the flip-flops in the observation circuit. Furthermore, it is also necessary to sufficiently pay attention to a Hold Time violation in data transfer between two flip-flops connected in series in the observation circuit (the same attention is required in a scan design of the type in which a scan clock is the same as a system clock). Where the vales at the observation points change in synchronism with respectively different clocks, it is necessary to arrange observation circuits respectively for different clocks.

An explanation will be given of the disable signal briefly mentioned with reference to FIG. 2. As described above, some of the observation points may make a settled value relative to only a fewer patterns as compared to others, and may take time to make a settled value after the system reset. Since the number of such observation points is small, preparing respective observation circuits only for them brings about an unnecessary increase in test circuits. For this reason, these observation points are included in a group of other observation points having similar behaviors, and each of them is set to be disable=1 in a test pattern to which they make no settled values. By doing so, the output of such an observation point is not inputted in the observation circuit to prevent the content of the observation circuit from being unknown. Specifically, the observation circuit is arranged to forcibly cause the input data from a specific observation point to be invalid and to be a fixed value.

Figure 5A:
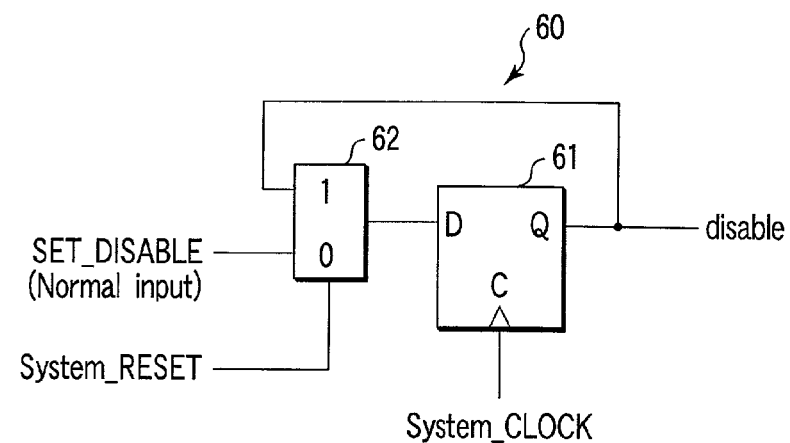
FIG. 5A is a circuit diagram showing a circuit for generating a disable signal according to the first embodiment.
Figure 5B:
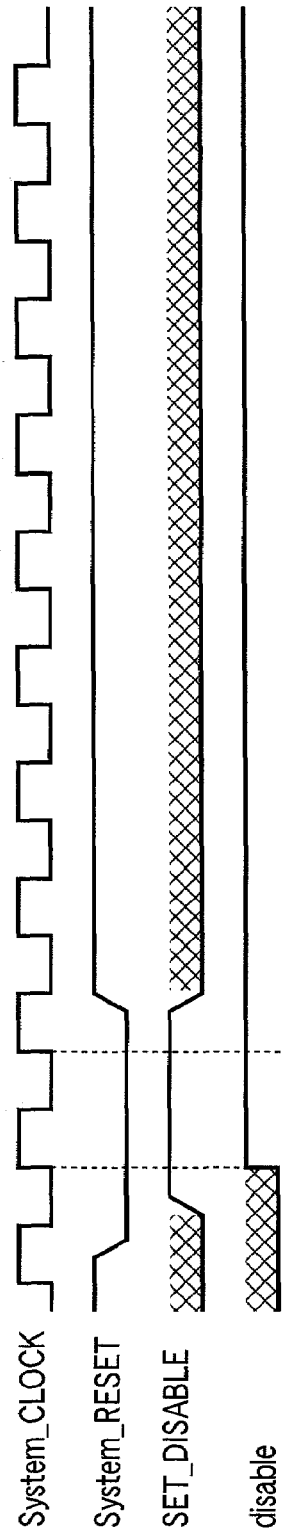
FIG. 5B is a timing chart showing signals in the circuit shown in FIG. 5A.

FIG. 5A is a circuit diagram showing a circuit for generating a disable signal according to the first embodiment. FIG. 5B is a timing chart showing signals in the circuit shown in FIG. 5A, i.e., a System_CLOCK signal, a System_RESET signal, a SET_DISABLE signal, and a disable signal.

As shown in FIG. 5A, a disable signal generation circuit 60 includes a flip-flop 61 and a multiplexer 62. The output of the flip-flop 61 and the SET_DISABLE signal inputted from the outside are subjected to a selection operation by the multiplexer 62 on the basis of System_RESET signal inputted from the outside. The signal selected by the multiplexer 62 comes to the input of the flip-flop 61. The output of the flip-flop 61 is the disable signal. As described above, a flip-flop to be active only upon the system reset is supplied with a value from an input terminal for normal operations, thereby easily realizing a disable signal.

As described above, the observation points 48 and the structure information 50 on the observation circuit and the control logic are obtained. The information, and an RTL net 51 of the LSI 10 or the gate level net 45 without logical optimization are inputted to a logical synthesis tool or a net change assist tool, by which the net of the LSI 10 added with the observation points, the observation circuit, and the control logic is changed (step S16). By doing so, there is provided a new gate level net 52 (circuit connection information at a second gate level) and concrete connection information 521 of the individual observation points relative to the observation circuit and the control logic. On the other hand, the test patterns 46 are subjected to a conversion operation corresponding to the new gate level net 52 by a pattern change tool, using the information 50 and the connection information 521 (step S17), so that new test patterns 53 (second test patterns) are formed.

A final fault coverage and a undetected fault list 54 are obtained as follows. Specifically, the observation points 48, and output terminals and input/output terminals in output state among the input/output terminals 44 of the LSI 10 are assigned as fault detection points. The undetected fault list 40, the original gate level net 45, and the test patterns 46 (generally formed of a plurality of test patterns) are inputted in a fault simulator, so that a final fault simulation (a third fault simulation) is performed (step S18).

As regards the test patterns 46, start timing of detecting faults at observation points is extracted for each of the test patterns 46, on the basis of information on the control logic and the reset timing. The timing is inputted into the fault simulator as additional information on the observation points, and the fault simulation is performed (see the broken line in FIG. 3A). By doing so, the fault simulation can be performed with actual reset timing, so that the final fault coverage and the undetected fault list 54 (a third undetected fault list) are obtained.

Where a fault simulator, which cannot directly utilize the information above described, is used, it is possible to use the following manner to obtain the same effect. Specifically, for example, a net is formed such that temporary buffers are added to the observation points of the gate level net 45. Then, using the outputs of these buffers as observation points, these outputs are forcibly set to be in an unknown state until reset timing.

In FIG. 3A, the final fault simulation is basically performed, using the gate level net, the test patterns, the input/output terminals, and the undetected fault list all obtained before the observation points are inserted. In this case, it is necessary to satisfy a condition such that most of the equivalent faults are located at positions logically shallowest from the output side (closest to the output of the related logic). If not, a strictly accurate result may not be obtained. This problem will be explained.

Figure 3B:
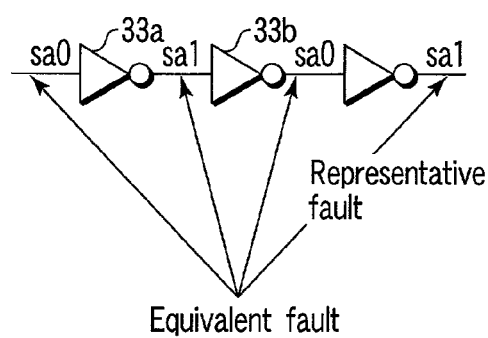
FIG. 3B is a view showing a structural example in which only one of the equivalent faults is used as a representative fault for a fault simulation.

In general, there are a number of groups of faults, which cause signals different from those of a normal circuit (with which an internal fault is detected) to be outputted in completely the same manner, when observed from the outside. The faults belonging to each of these groups are called equivalent faults. In order to obtain a fault coverage, as shown in FIG. 3B, it suffices if only one of the equivalent faults is used as a representative fault for a fault simulation. Information on the relationship between the equivalent faults and the representative fault is (or can be) included in a fault list. Being effective in reducing CPU time, an ordinary fault simulation is performed only on the representative faults, and then its result is combined with the information on the equivalent faults and the representative faults in the fault list, so that a fault coverage is outputted. The method of selecting the representative faults differs, depending on the fault simulation.

With reference to FIG. 3B, inserting observation points will be discussed. In FIG. 3B, sa0 and sa1 denote a stuck-at-zero fault and a stuck-at-one fault, respectively. If a stuck-at-one fault at the output of the first inverter 33a in an inverter chain is selected as a representative fault, and the corresponding four faults have not yet been detected, inserting an observation point into the node of the representative fault does not allow the faults of an output of an inverter 33b and more distant sides to be detected. Accordingly, inserting an observation point in this manner may cause a problem in that equivalent faults in the original gate net partly become unequivalent faults. In this respect, if selection can be always performed such that each selected representative fault is closest to the output side among related equivalent faults, inserting an observation point is most effective, and thus part of the flow shown in FIG. 3A in relation to the final fault simulation is preferable. However, this is not always true in common fault simulators.

FIG. 3C is a flowchart showing a method of determining observation points in a semiconductor IC device, according to a modification of the first embodiment in light of this aspect. The flow shown in FIG. 3C differs from the flow shown in FIG. 3A in relation to a final fault simulation (a third fault simulation).

Specifically, faults in an observation circuit used as a test circuit are first deleted from a fault list, which is obtained by re-extracting assumed faults from a gate level net obtained after change. Such an extraction function is included in a usual fault simulator. Furthermore, those corresponding to detected faults in the fault list obtained by a first fault simulation are treated as detected ones or deleted. By doing so, a fault list 401 including the left faults, to be used for the final fault simulation, is obtained (step S175). Then, the gate level net list 52 obtained after change, input/output terminals 55 obtained after the observation circuit is added, and test patterns 53 obtained after conversion are inputted into a fault simulator, so that the final fault simulation (the third fault simulation) is performed (step S18).

Where faults detected by the first fault simulation are deleted, it is necessary to merge a deleted result with a simulation result after the final fault simulation (not shown). Furthermore, it is preferable to independently evaluate the fault coverage of the test circuit, so as to diagnose the cause of faults efficiently.

Where all the test patterns are serially applied to the LSI 10, and it is confirmed that unsettled (unknown) values do not appear at the observation points in and after the second test pattern, the observation points do not have to be divided into groups in terms of reset timing. However, there is a case where a fault analysis efficiency in the case of faults being detected in the middle of a test become much low, and some fault simulator can not be used in practice, since a fault simulation needs to be performed with a very long test pattern. Accordingly, it is preferable to add a reset logic described above, except that there is a strict restriction in terms of the number of circuits added for tests. As regards a clock input into the observation circuit 20, a normal operation mode is divided into a mode in which the observation circuit 20 is not operated (CLK does not vary), and a mode in which the observation circuit 20 is operated, and the former mode is used except for the tests, so that the consumption power is reduced.

According to this embodiment, observation points are selected on the basis of undetected faults obtained by a fault simulation. Test patterns are those for the normal operation. As a result, it is possible to improve the fault coverage while suppressing test circuit addition at the minimum, as compared to conventional techniques.

In this embodiment, the undetected fault list 40 is a result obtained by performing a fault simulation with the test patterns 46 on the gate level net 45 of the LSI 10. However, in general, since a fault simulation requires a very long CPU time (calculation time), it is important to efficiently obtain the undetected fault list 40 according to this embodiment.

Figure 6:
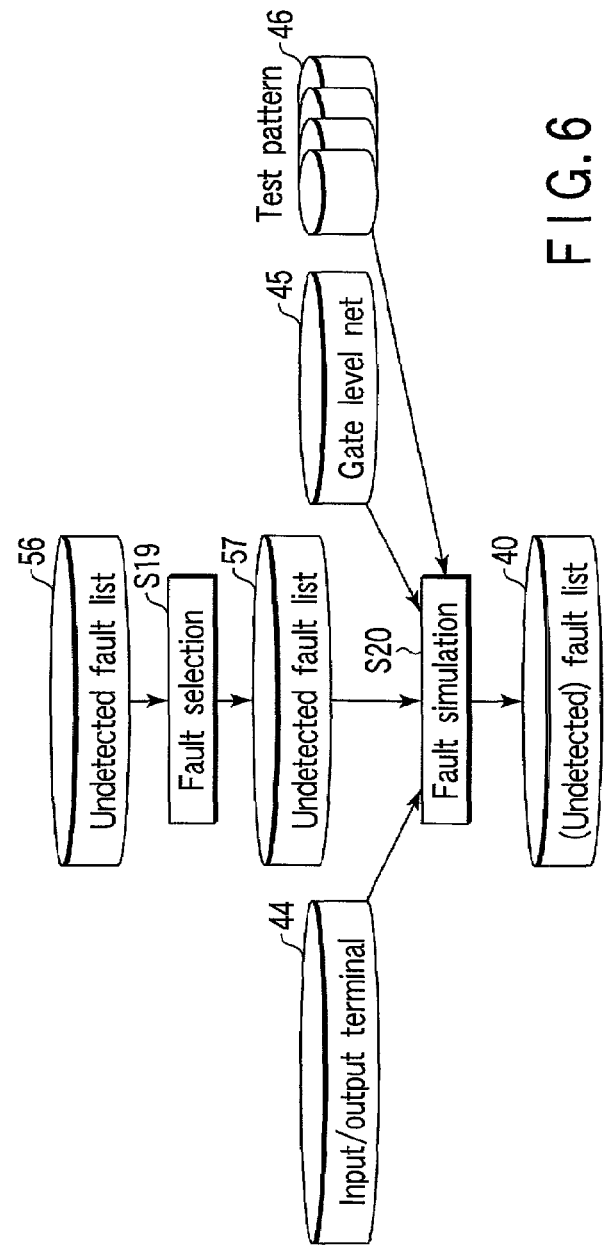
FIG. 6 is a flowchart showing a method of determining observation points in a semiconductor IC device, according to another modification of the first embodiment.

FIG. 6 is a flowchart showing a method of determining observation points in a semiconductor IC device, according to another modification of the first embodiment.

In this modification, the following process is performed to obtain an undetected fault list 40 (a first undetected fault list), which becomes an input into the flow shown in FIG. 3A. First, among faults in an undetected fault list 56 (a fourth undetected fault list) in a gate level net 45 of the LSI 10, those that can be recognized with node names on an RTL net are selected (step S19), so that an undetected fault list 57 is obtained. Then, using the undetected fault list 57, a fault simulation (a first fault simulation) is performed (step S20), so that the undetected faults 40 (a first undetected fault list) are obtained.

According to this modification, it is possible to greatly reduce the CPU time (calculation time) necessary until the undetected fault list 40 is obtained. Note this fault simulation, the fault simulation for estimating effects of inserting observation points, and the fault simulation for final confirmation do not necessarily have to be performed by the same fault simulator. The fault simulation for final confirmation requires a long CPU time, because it is performed for faults including not only faults that can be recognized with node names on an RTL net but also other faults. In general, commercially available fault simulators include ones whose execution environment is easily prepared, and ones whose performance is high (the CPU time is short). The fault simulations for obtaining the first undetected fault list, and for estimating effects of inserting observation points may be performed by the former fault simulator. The fault simulation for final confirmation may be performed by the latter fault simulator. With this arrangement, the entire test efficiency will be improved.

Figure 7:
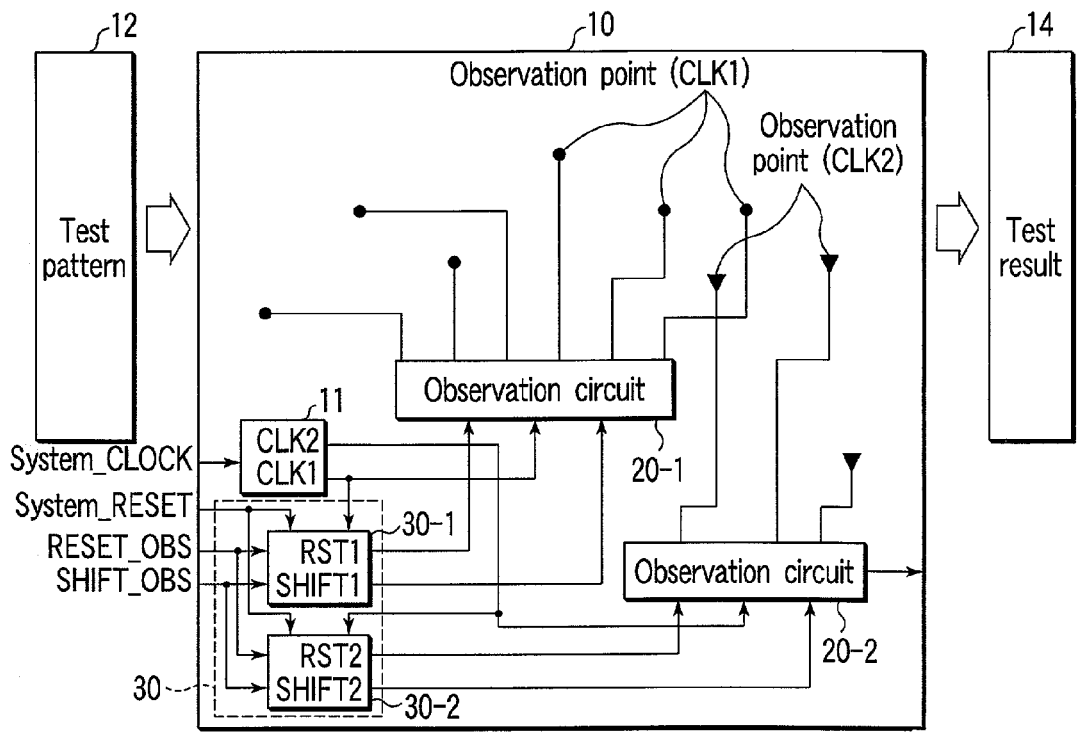
FIG. 7 is a block diagram showing a semiconductor IC device according to still another modification of the first embodiment.

FIG. 7 is a block diagram showing a semiconductor IC device according to still another modification of the first embodiment.

This modification shows a case where observation points, i.e., nodes in the LSI 10, are divided into groups in terms of change in synchronism with different clocks. In this case, observation circuits and test control logics are arranged basically for respective groups of observation points to change in synchronism with their own clocks.

As shown in FIG. 7, the LSI 10 includes a clock generation circuit 11 for generating two different clock signals CLK1 and CLK2 from a System_CLOCK signal, and a control circuit 30 having a control logic 30-1 operated by the clock signal CLK1, and a control logic 30-2 operated by the clock signal CLK2. The control logics 30-1 and 30-2 generate a reset signal RST1 and a shift signal SHIFT1, and a reset signal RST2 and a shift signal SHIFT2, respectively, in accordance with a RESET_OBS signal and a SHIFT_OBS signal.

The interior of the LSI 10 is operated in synchronism with the clocks CLK1 and CLK2. Observation points (indicated with black circular symbols) operated in synchronism with the CLK1 are connected to an observation circuit 20-1 operated in synchronism with the CLK1. The observation circuit 20-1 is controlled by the control logic 30-1 operated in synchronism with the CLK1. Similarly, observation points (indicated with black triangle symbols) operated in synchronism with the CLK2 are connected to an observation circuit 20-2 operated in synchronism with the CLK2. The observation circuit 20-2 is controlled by the control logic 30-2 operated in synchronism with the CLK2. The control logics may be constituted to be one control logic in appearance.

Observation points may be connected to an observation circuit operated in synchronism with a clock different from a clock, which the observation points operated in synchronism with, if settled values are definitely inputted in the observation circuit. For example, where the interior of the LSI 10 is operated in synchronism with two different clocks, which have the same cycle and reverse phases, and an observation point is a flip-flop output operated in synchronism with one of the clocks, no problem is caused even if the observation point is connected to an observation circuit operated in synchronism with the other of the clocks.

SECOND EMBODIMENT

Figure 8:
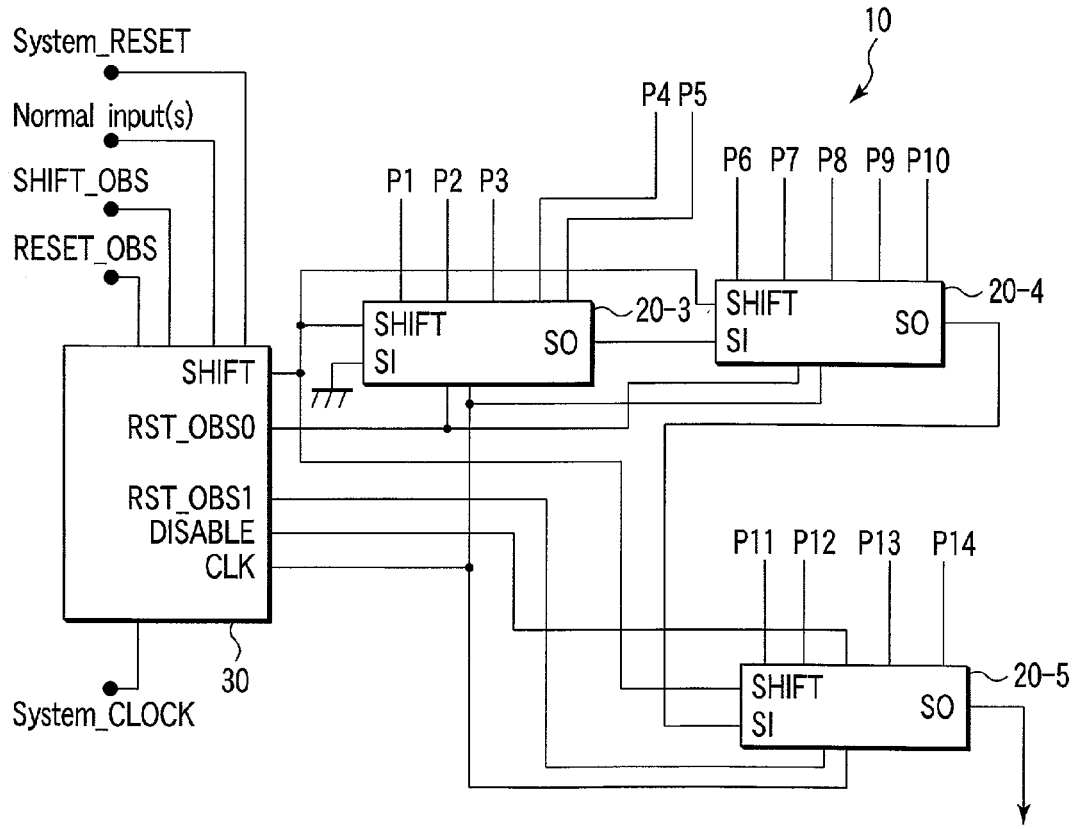
FIG. 8 is a block diagram showing a semiconductor IC device according to a second embodiment of the present invention.

FIG. 8 is a block diagram showing a semiconductor IC device according to a second embodiment of the present invention. The block diagram shows the internal structure of an LSI, and particularly a circuit used for a test.

As shown in FIG. 8, the LSI 10 according to this embodiment includes three observation circuits 20-3 to 20-5 corresponding to groups of observation points, as described in the first embodiment. The observation circuits 20-3 and 20-4 receive the same control by a RST_OBS0 signal outputted by a control circuit 30, but are formed as two separate observation circuits in light of easiness in implementation and fault analysis. The internal structure of each of the observation circuits 20-3 to 20-5 is the same as that shown in FIG. 2. Signature-compression operations in the observation circuits 20-3 to 20-5 are performed respectively for the observation circuits. Shift operations are performed in a state where all the observation circuits 20-3 to 20-5 are connected in series.

Figure 9A:
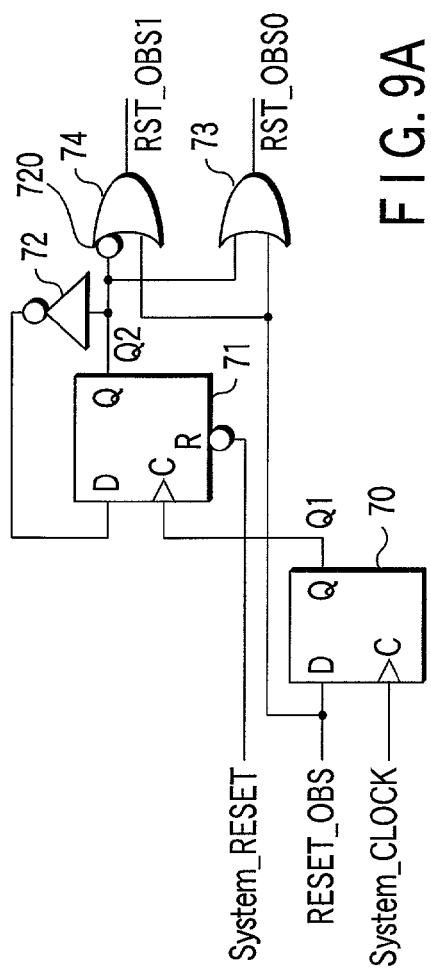
FIG. 9A is a circuit diagram showing a reset logic for generating two internal reset signals in a semiconductor IC device according to the second embodiment.
Figure 9B:
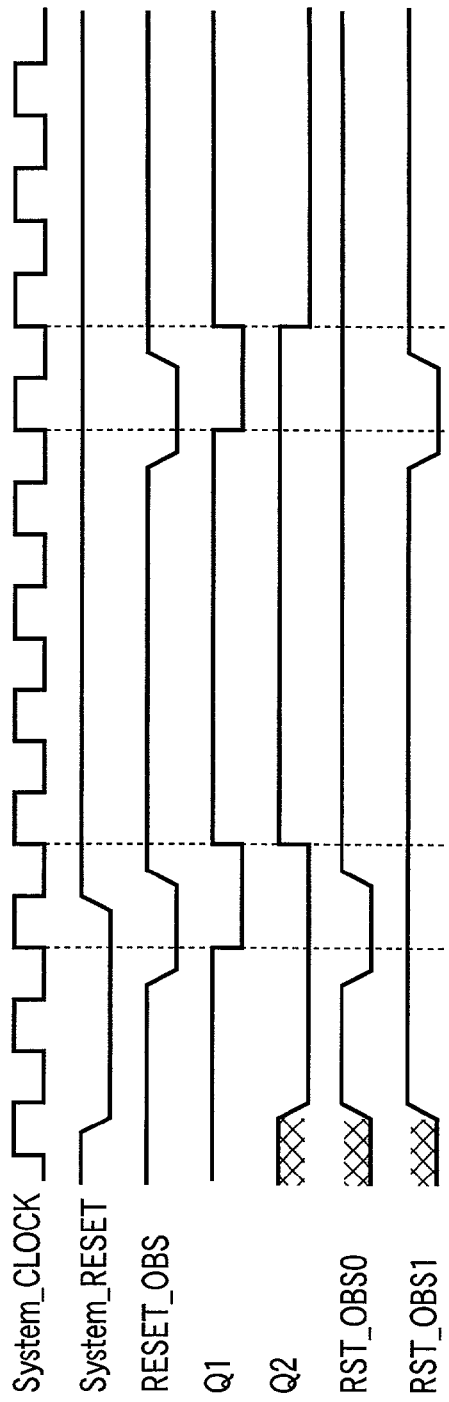
FIG. 9B is a timing chart showing signals in the circuit shown in FIG. 9A.

FIG. 9A is a circuit diagram showing a reset logic for generating two internal reset signals in a semiconductor IC device according to the second embodiment. FIG. 9B is a timing chart showing signals in the circuit shown in FIG. 9A.

As shown in FIG. 9A, the reset logic includes two flip-flops 70 and 71, inverters 72 and 720 (only an inversion symbol is shown), and two OR gates 73 and 74. The flip-flop 70 is controlled by a System_CLOCK signal, and receives as an input a RESET_OBS signal. The flip-flop 71 is controlled by the Q output Q1 of the flip-flop 70 and a System_RESET signal, and receives as an input the Q output Q2 of the flip-flop 71 inverted by the inverter 72. An inverted signal of the Q output Q2 of the flip-flop 71, and the RESET_OBS signal are subjected to an OR operation by an OR gate 74. The output of the OR gate 74 is a RST_OBS1 signal. The Q output Q2 of the flip-flop 71, and the RESET_OBS signal are subjected to an OR operation by an OR gate 73. The output of the OR gate 73 is a RST_OBS0 signal.

The circuit described above is initialized by the System_RESET signal, and, as shown in FIG. 9B, every time the RESET_OBS signal becomes active ("L" level), the RST_OBS0 and RST_OBS1 signals become active in this order.

Figure 10A:
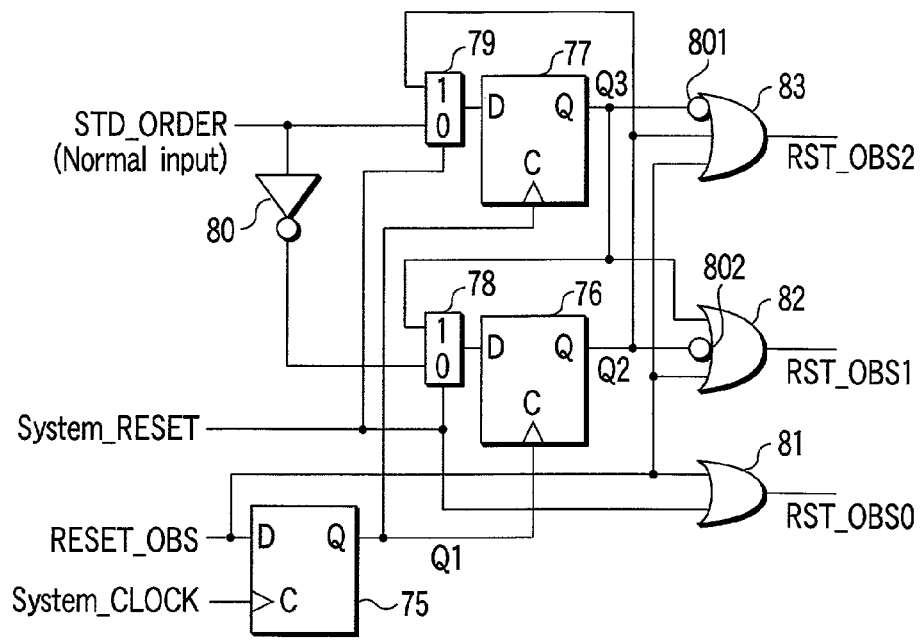
FIG. 10A is a circuit diagram showing a reset logic for generating three internal reset signals in a semiconductor IC device according to a modification of the second embodiment.
Figure 10B:
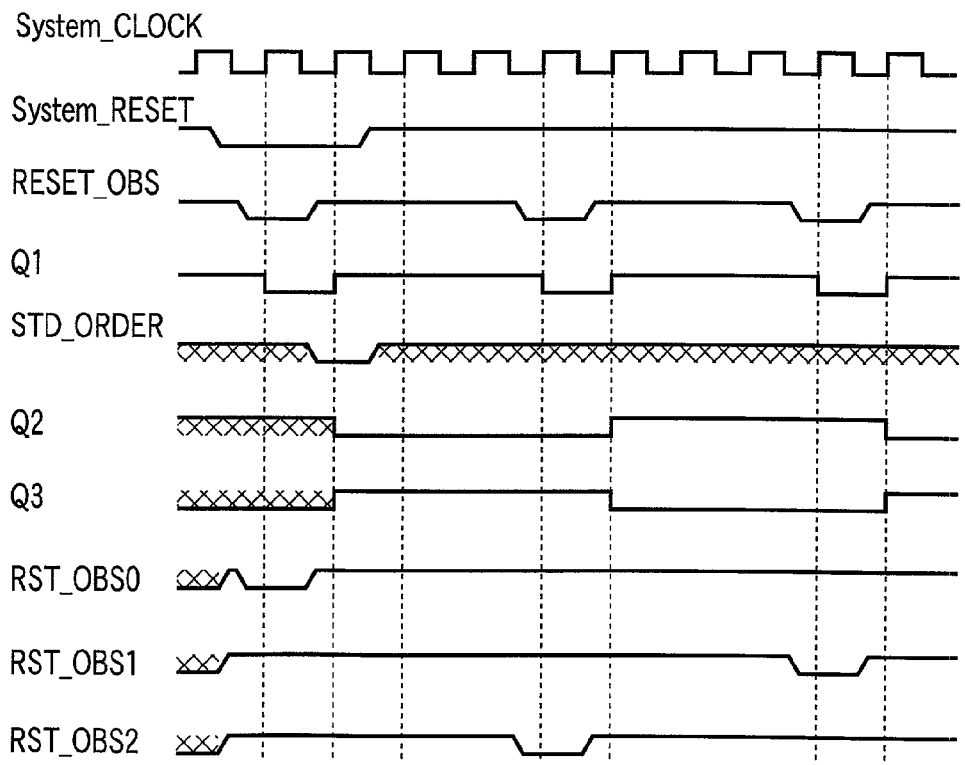
FIG. 10B is a timing chart showing signals in the circuit shown in FIG. 10A.

FIG. 10A is a circuit diagram showing a reset logic for generating three internal reset signals in a semiconductor IC device according to a modification of the second embodiment. FIG. 10B is a timing chart showing signals in the circuit shown in FIG. 10A.

As shown in FIG. 10A, the reset logic includes three flip-flops 75 to 77, two multiplexers 78 and 79, three inverters 80, 801 and 802 (only inversion symbols are shown), and three OR gates 81 to 83. The flip-flop 75 is controlled by a System_CLOCK signal, and receives as an input a RESET_OBS signal. The Q output Q1 of the flip-flop 75 functions as a clock for the flip-flops 76 and 77. The flip-flops 76 and 77 receive as inputs the outputs of the multiplexers 78 and 79, respectively.

A STD_ORDER signal inputted from the outside and inverted by the inverter 80, and the output of the flip-flop 77 are subjected to a selection operation by the multiplexer 78 on the basis of a System_RESET signal. The STD_ORDER signal and the output of the flip-flop 76 are subjected to a selection operation by the multiplexer 79 on the basis of the System_RESET signal.

The System_RESET signal and the RESET_OBS signal are subjected to an OR operation by the OR gate 81. This operation result is a RST_OBS0 signal. The RESET_OBS signal, an inverted signal of the Q output Q2 of the flip-flop 76, and the Q output Q3 of the flip-flop 77 are subjected to an OR operation by the OR gate 82. This operation result is a RST_OBS1 signal. The RESET_OBS signal, the Q output Q2 of the flip-flop 76, and an inverted signal of the Q output Q3 of the flip-flop 77 are subjected to an OR operation by the OR gate 83. This operation result is a RST_OBS2 signal.

The circuit described above is initialized by the System_RESET signal. When STD_ORDER=1, every time the RESET_OBS signal becomes active, the RST_OBS0, RST_OBS1, and RST_OBS2 signals become active in this order. When STD_ORDER=0 (FIG. 10B), every time the RESET_OBS signal becomes active, the RST_OBS0, RST_OBS2, and RST_OBS1 signals become active in this order. As described above, the RST_OBS1 signal and the RST_OBS2 signal can be active in any order in accordance with initial setting, thereby allowing more detailed reset logic design.

In FIGS. 9A, 9B, 10A, and 10B, each of the RST_OBSi (i=0, 1, . . . ) signals outputted from the reset logic is formed by an OR operation, using the external (asynchronous) RESET_OBS signal. However, each of the RST OBSi (i=0, 1, . . . ) signals may be formed by a combination of flip-flop outputs operated in synchronism with the clock CLK.

THIRD EMBODIMENT

Figure 11:
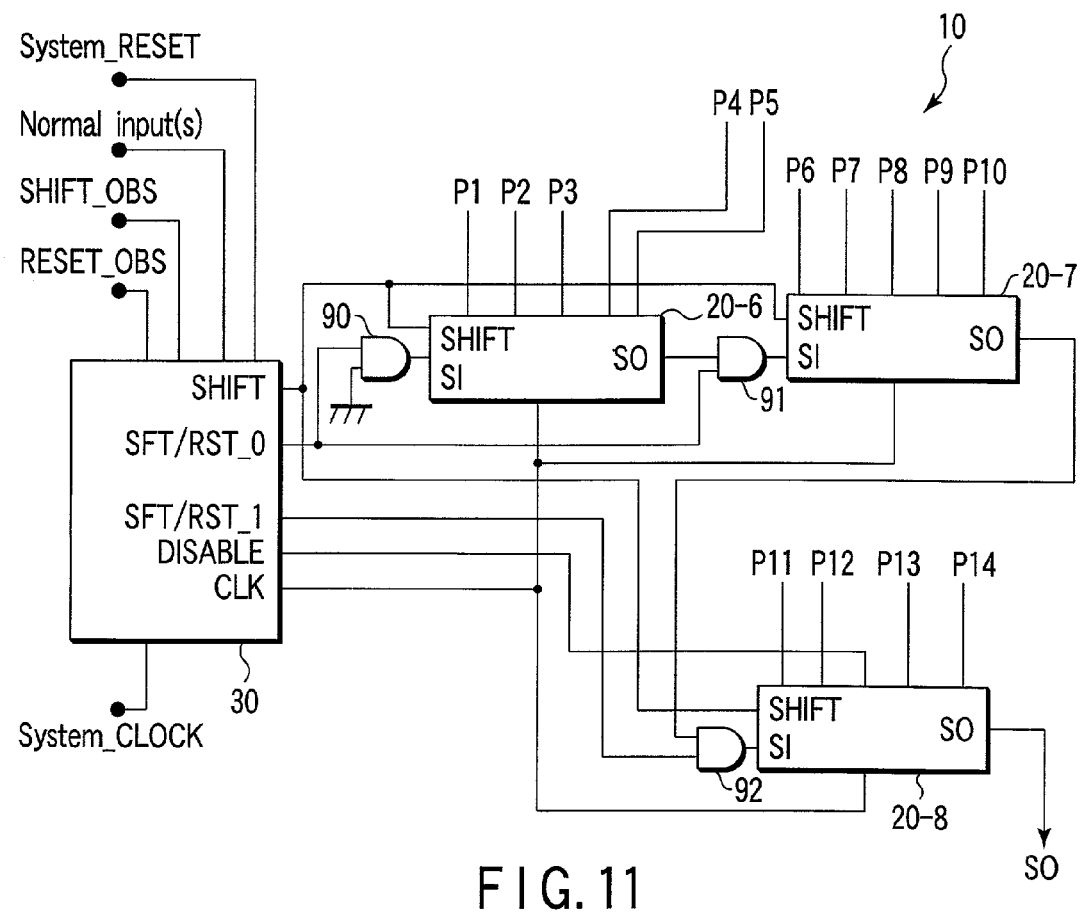
FIG. 11 is a block diagram showing a semiconductor IC device according to a third embodiment of the present invention.

FIG. 11 is a block diagram showing a semiconductor IC device according to a third embodiment of the present invention. The block diagram shows the internal structure of an LSI 10, and particularly a circuit used for a test. This embodiment relates to a technique in which resetting of observation circuits is not performed by asynchronous reset, but is serially performed through an SI input. Specifically, the control circuit includes a control logic for generating an internal reset signal, and resets the observation circuits, utilizing a serial operation.

As shown in FIG. 11, the control circuit 30 generates SFT/RST_0 and SFT/RST_1 signals. The SFT/RST_0 signal and the GND are subjected to an AND operation by an AND gate 90. This operation result is inputted into a scan-in terminal SI of an observation circuit 20-6. The output SO of the observation circuit 20-6 and the SFT/RST_0 signal are subjected to an AND operation by an AND gate 91. This operation result is inputted into a scan-in terminal SI of an observation circuit 20-7. The output SO of the observation circuit 20-7 and the SFT/RST_1 signal are subjected to an AND operation by an AND gate 92. This operation result is inputted into a scan-in terminal SI of an observation circuit 20-8.

Figure 12:
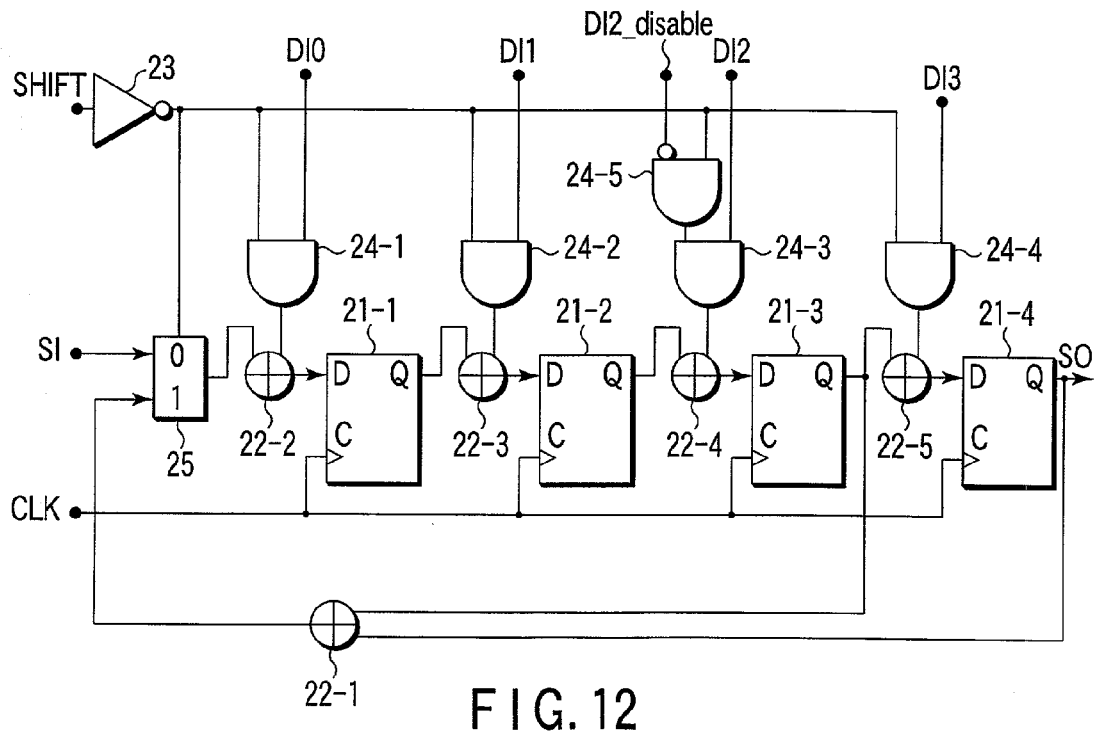
FIG. 12 is a circuit diagram showing an observation circuit in a semiconductor IC device according to third embodiment.

FIG. 12 is a circuit diagram showing one of observation circuits 20-6 to 20-8 in a semiconductor IC device according to third embodiment. As shown in FIG. 12, this arrangement differs from that shown in FIG. 2, in that portions relating to the reset signal RST are omitted.

Figure 13:
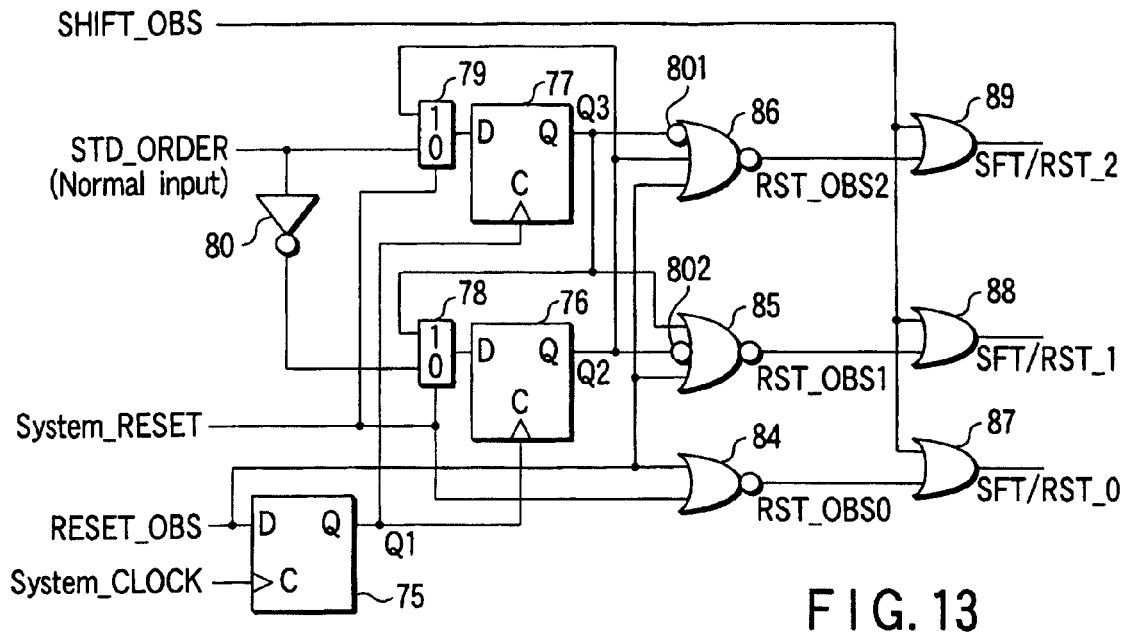
FIG. 13 is a circuit diagram showing the internal reset logic of a control circuit in a semiconductor IC device according to third embodiment.

FIG. 13 is a circuit diagram showing the internal reset logic (for three internal reset signals) of a control circuit 30 in a semiconductor IC device according to third embodiment. As shown in FIG. 13, this reset logic differs from that shown in FIG. 10A, in that the OR gates 81 to 83 are replaced with NOR gates 84 to 86, and OR gates 87 to 89 are further added. Specifically, RST_OBS0 to RST_OBS2 signals and a SHIFT_OBS signal are subjected to an OR operation. These operation results are a SFT/RST_0, a SFT/RST_1, and a SFT/RST_2 signal.

This reset logic is initialized by a System_RESET signal. When STD_ORDER=1, every time the RESET_OBS signal becomes active, the SFT/RST_0, SFT/RST_1, and SFT/RST_2 signals become "0" in this order. When TD_ORDER=0, every time the RESET_OBS signal becomes active, the SFT/RST_0, SFT/RST_2, and SFT/RST_1 signals become "0" in this order. In order to reliably reset the observation circuits 20-6 to 20-8, the RESET_OBS signal needs to become active at least over the number of cycles corresponding to the maximum number of bits in these circuits. However, according to this embodiment, since flip-flops without reset input are utilized, the observation circuits bears a smaller circuit overhead.

FOURTH EMBODIMENT

An explanation will be given of a semiconductor IC device and a test method thereof, according to a fourth embodiment of the present invention. In the embodiments described above, a flip-flop of one bit in an observation circuit basically corresponds to one observation point. However, in practice, where observation points are added, usually a certain fault is additionally detected only in some of all the test patterns, and it is actually detected only in some observation points. Furthermore, there may be some groups of observation points in which faults are detected only in different test patterns. Accordingly, redundant portions in the structure can be found by analyzing detailed information on detection performed by test patterns on undetected faults (e.g., detection time and observation points at which faults are detected). On the basis of this analysis result, it is possible to form an observation circuit with a fewer circuit portions added for a test.

FIG. 14A is a flowchart showing a method of determining observation points in a semiconductor IC device, according to a fourth (or a fifth) embodiment of the present invention. As shown in FIG. 14A, in this flow, optimum points, an observation circuit, and a control logic are determined on the basis of observation point information 42, a fault simulation result list 47 including detailed information, and a logical simulation result 49 on observation points performed by test patterns (step S21).

As in the flow shown in FIG. 3A according to the first embodiment, FIG. 14A shows a flow in the case of satisfying a condition such that almost all representative faults are located at positions logically shallowest among corresponding equivalent faults, viewed from the outside, in relation to a final fault simulation (a third fault simulation). However, this is not always true in common fault simulators.

Figure 14B:
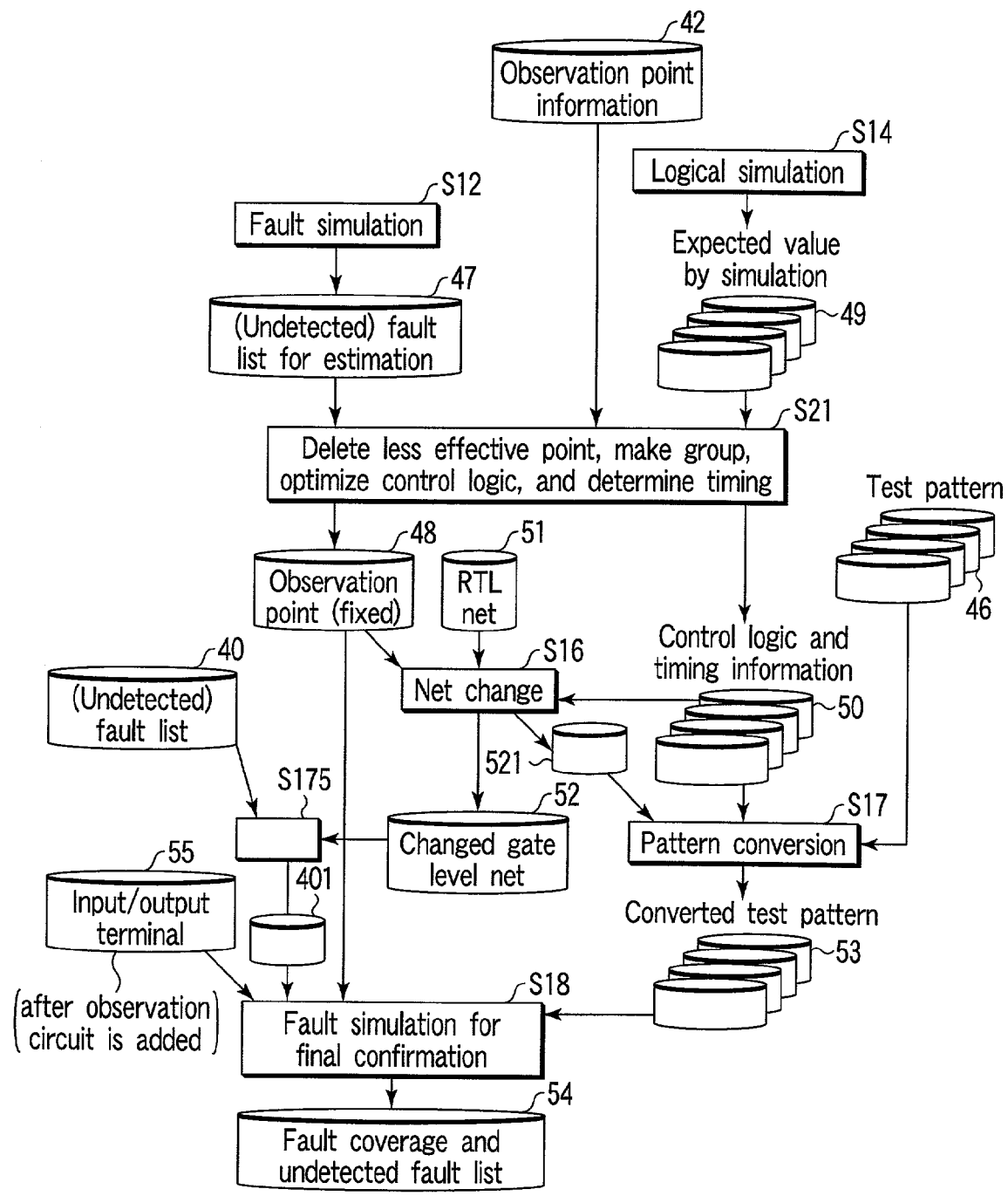
FIG. 14B is a flowchart showing a method of determining observation points in a semiconductor IC device, according to a modification of the fourth or fifth embodiment.
Figure 17A:
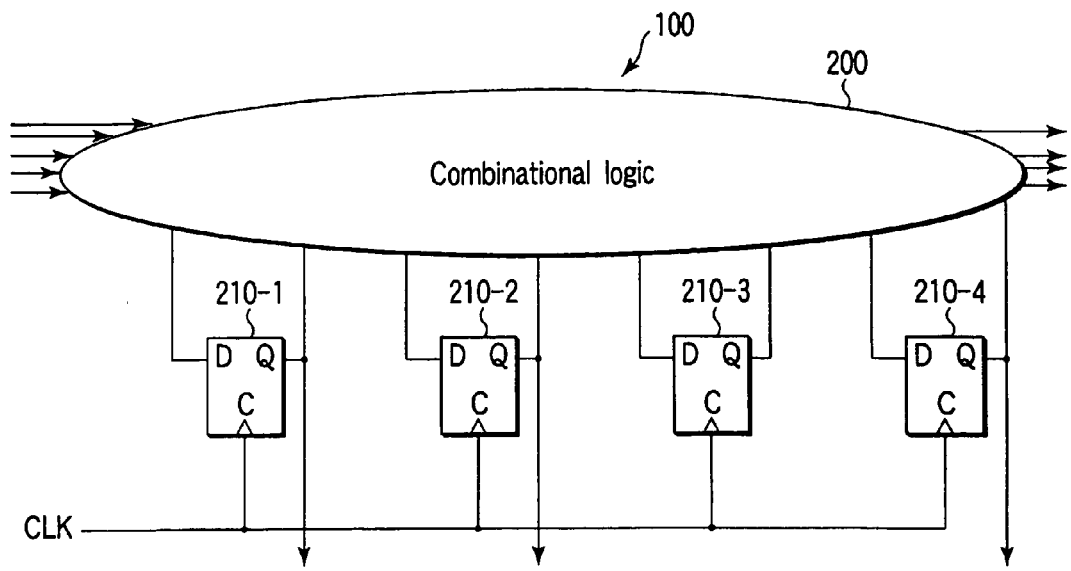
FIG. 17A is a block diagram schematically showing the internal structure of a conventional semiconductor IC device.
Figure 17B:
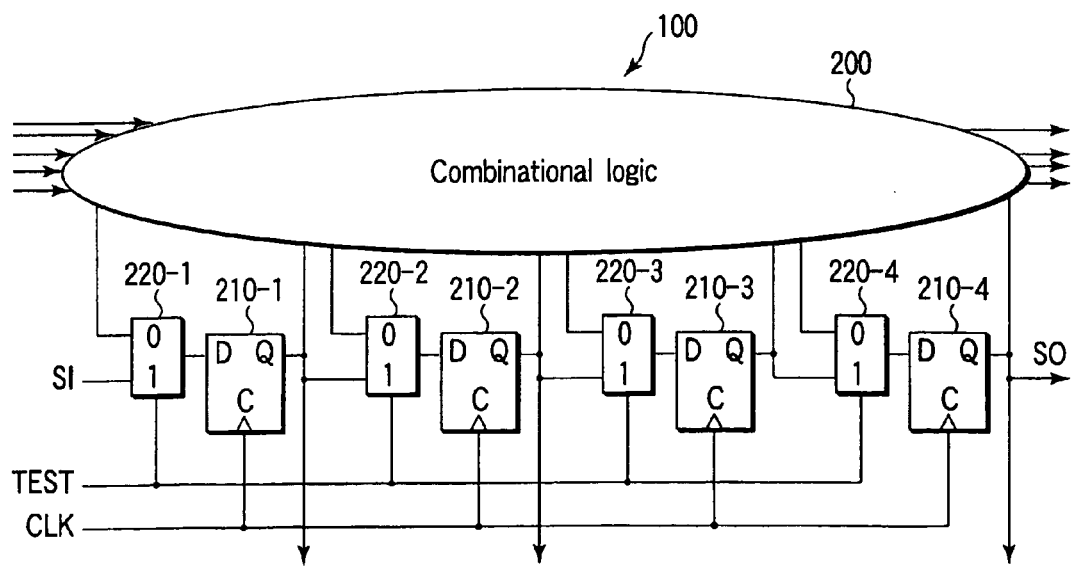
FIG. 17B is a block diagram schematically showing the internal structure of a conventional semiconductor IC device, formed by modifying the structure shown in FIG. 17A with a basic scan design method.
Figure 18:
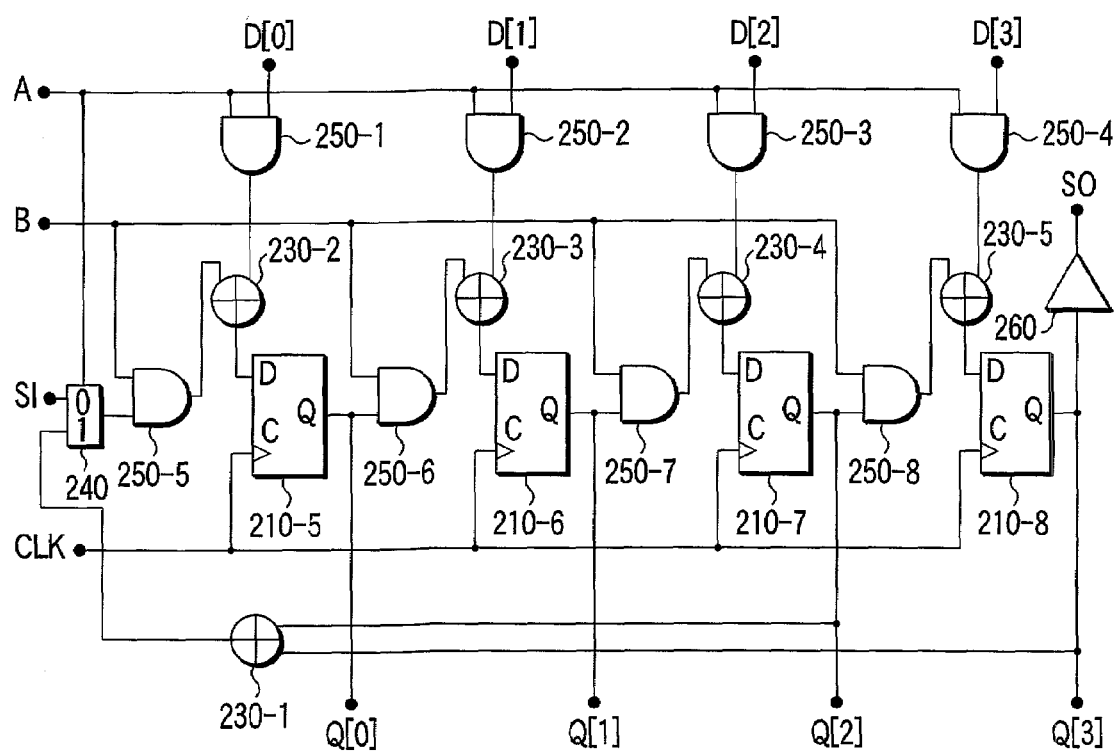
FIG. 18 is a circuit diagram showing a conventional observation circuit in a semiconductor IC device.

FIG. 14B is a flowchart showing a method of determining observation points in a semiconductor IC device, according to a modification of the fourth (or the fifth) embodiment in light of this aspect. The flow shown in FIG. 14B differs from the flow shown in FIG. 14A in relation to a final fault simulation (a third fault simulation).

Specifically, faults in an observation circuit used as a test circuit are first deleted from a fault list, which is obtained by re-extracting assumed faults from a gate level net obtained after change. Furthermore, those corresponding to detected faults in the fault list obtained by a first fault simulation are treated as detected ones or deleted. By doing so, a fault list 401 including the left faults, to be used for the final fault simulation, is obtained (step S175). Then, the gate level net list 52 obtained after change, input/output terminals 55 obtained after the observation circuit is added, and test patterns 53 obtained after conversion are inputted into a fault simulator, so that the final fault simulation (the third fault simulation) is performed (step S18).

Where faults detected by the first fault simulation are deleted, it is necessary to merge a deleted result with a simulation result after the final fault simulation (not shown). Furthermore, it is preferable to independently evaluate the fault coverage of the test circuit, so as to diagnose the cause of faults efficiently.

Figure 15:
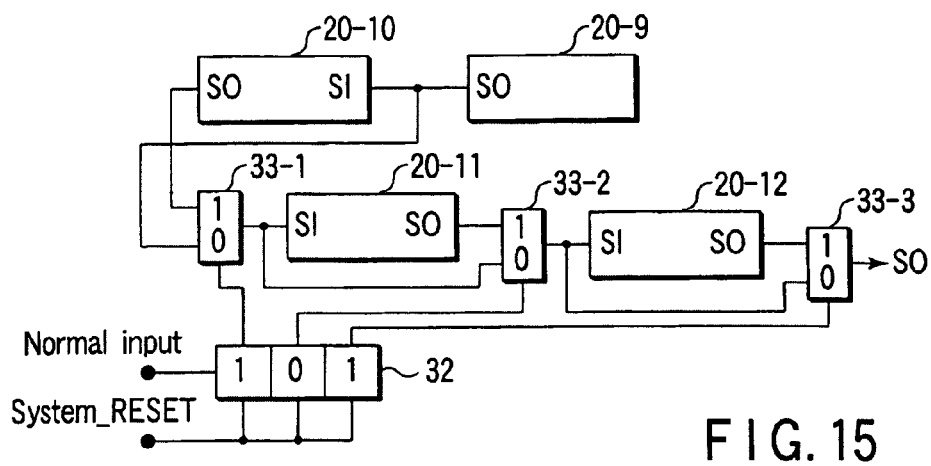
FIG. 15 is a block diagram showing the internal structure of a semiconductor IC device, according to the fourth embodiment.

FIG. 15 is a block diagram showing the internal structure of a semiconductor IC device (LSI), according to the fourth embodiment. This structure is formed in light of the fact that a fault is not detected by some of the observation circuits in each of the test patterns. In FIG. 15, reference symbols 20-9 to 20-12 denote observation circuits, and reference symbols 33-1 to 33-3 denote two-input multiplexers.

Specifically, during system reset of a LSI 10, a control circuit 32 is set at a value through a suitable input terminal for normal operations. With this setting, the flip-flops of an observation circuit in which no fault is detected are skipped, and a serial transfer is performed (the structure of the control circuit 32 is the same as that for providing a disable signal). In the structure shown in FIG. 15, since no fault is detected in an observation circuit 20-11, "0" is given to the corresponding bit of the control circuit 32, so that data of this part is skipped when a serial transfer is performed. As a result, the read-out time of a test result is shortened.

FIFTH EMBODIMENT

Figure 16:
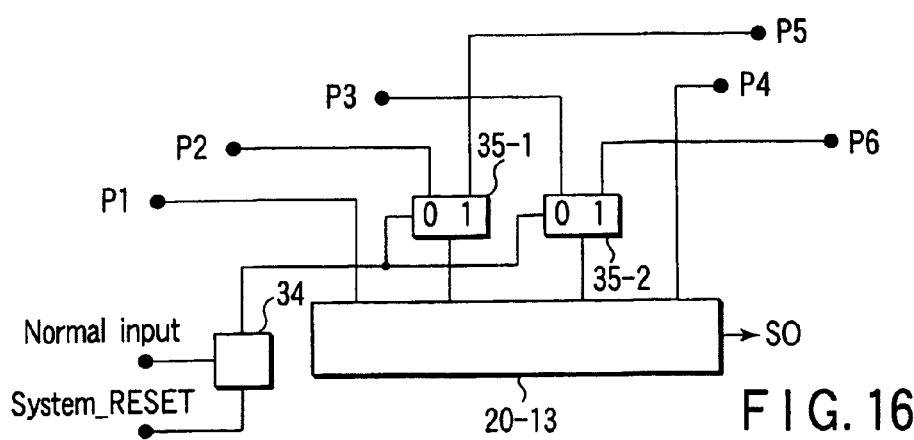
FIG. 16 is a block diagram showing the internal structure of a semiconductor IC device, according to the fifth embodiment.

An explanation will be given of a semiconductor IC device and a test method thereof, according to a fifth embodiment of the present invention. According to this embodiment, a flow of determining observation points is performed as in the flow shown in FIG. 14A or 14B. FIG. 16 is a block diagram showing the internal structure of a semiconductor IC device (LSI), according to the fifth embodiment (portions irrelevant to this embodiment are omitted). This structure relates to a method of reducing the number of the bits of an observation circuit corresponding to some of the observation points.

It is assumed that test patterns on a target LSI and detection circumstances at observation points are as shown in Table 4.

TABLE 4

|     | P1 | P2 | P3 | P4 | P5 | P6 |
|-----|----|----|----|----|----|----|
| TP1 | D2 | D3 | U  | U  | U  | U  |
| TP2 | U  | U  | U  | D1 | D5 | U  |
| TP3 | U  | D1 | D2 | D3 | U  | U  |
| TP4 | U  | U  | U  | U  | D2 | D4 |
| TP5 | D2 | U  | D1 | U  | U  | U  |

In Table 4, TPi (i=1 to 5) denotes the types of test patterns, and Pj (j=1 to 6) denotes observation points. Dn means that a (n)-number of faults are detected, while U means that no fault is detected. As easily understood from Table 4, pairs of observation points (P2, P5) and (P3, P6) have no overlap of test patterns in which a fault is detected. Furthermore, the pairs (P2, P3) and (P5, P6) have an exclusive relationship as to whether a fault is detected or not in each test pattern. Accordingly, as shown in FIG. 16, these pairs are inputted into respective inputs of two-input multiplexers 35-1 and 35-2. The outputs of multiplexers 35-1 and 35-2 are connected to inputs of an observation circuit 20-13 in an LSI 10. As described above, a circuit 34 can be set at "0" or "1" through a suitable input terminal for normal operations during system reset. The output of the circuit 34 is used as a selection signal for the multiplexers.

A method according to this embodiment is performed as follows:

(1) First, it is performed to extract all the pairs of observation points having no overlap of test patterns in which a fault is detected. In this embodiment, pairs of observation points (P1, P4), (P1, P5), (P1, P6), (P2, P5), (P2, P6), (P3, P5), (P3, P6), and (P4, P6) satisfy this condition. These are candidates for inputs to the two-input multiplexer.

(2) In the pairs of observation points (Pi, Pj) extracted in the step (1), "0" is defined when a fault is detected at Pi and not detected at Pj, "1" is defined when vice versa, and "x" is defined when no fault is detected at either of them. Table 5 shows this result in this embodiment. These "0", "1", and "x" provide (or engage with) selection signals for multiplexers. When the "x" is given, the selection signal can be either of them.

TABLE 5

|     | (P1, P4) | (P1, P5) | (P1, P6) | (P2, P5) | (P2, P6) | (P3, P5) | (P3, P6) | (P4, P6) |
|-----|----------|----------|----------|----------|----------|----------|----------|----------|
| TP1 | 0        | 0        | 0        | 0        | 0        | x        | x        | x        |
| TP2 | 1        | 1        | x        | 1        | x        | 1        | x        | 0        |
| TP3 | 1        | x        | x        | 0        | 0        | 0        | 0        | 0        |
| TP4 | x        | 1        | 1        | 1        | 1        | 1        | 1        | 1        |
| TP5 | 0        | 0        | 0        | x        | x        | 0        | 0        | x        |

(3) On the basis of the Table obtained in the step (2), it is performed to select pairs of observation points having no contradiction therebetween over all the test patterns. The "x" is compatible with either of the "0" and the "1". Furthermore, specific pairs may be selected while exchanging left and right positions of the observation points, if those obtained by performing on the specific pairs a change, from "0" to "1" and from "1" to "0" over all the test patterns, are not contradictory to the other pairs.

In this embodiment, the following pairs satisfy this condition.

| (P1, P5), (P2, P6) |
| (P1, P6), (P2, P5) |
| (P2, P5), (P3, P6) |
| (P2, P6), (P3, P5) |

These are equal in terms of effects on area reduction. The structure shown in FIG. 16 is formed on the basis of the third pairs. In this structure, the values of selection signals for multiplexers (programmed in the flip-flop 34) are "0", "1", "0", "1", and "0" relative to TP1 to TP5, respectively.

According to this embodiment, the number of flip-flops used in an observation circuit can be smaller than that of observation points, so that an increase in area due to addition of a test circuit is further suppressed.

According to the first to fifth embodiments, observation points (addition of an observation circuit) are selected only from nodes corresponding to undetected faults obtained by a fault simulation, which is performed by using test patterns for normal operations. Accordingly, it is possible to remarkably reduce additional test circuits, as compared to a scan design technique, which requires test circuits to be added to enable all the register to be scan-operable in principle. Furthermore, test patterns to be used can be obtained by slightly changing those for normal operations, and tests can be performed with clock frequencies substantially the same as those for normal operations. Accordingly, it is possible to achieve a sufficiently high fault coverage with far less effort, as compared to the conventional techniques. As a result, a high fault coverage can be obtained with lower cost and higher efficiency, as compared to the conventional techniques. There may be a case that test patterns are added manually or automatically during the flow of determining observation points. In such a case, actual flow should be somewhat modified. However, even such a case can not affect the essentials of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a test target circuit including a plurality of nodes and terminals;
a control circuit configured to generate an internal reset signal, and an internal operation mode signal, in response to an external clock signal or an internal clock signal generated from the external clock signal, an external reset signal, and an external operation mode signal inputted therein; and
an observation circuit configured to receive input data from observation points of the test target circuit through branches to the observation circuit, in order to observe a test that causes the test target circuit to perform a substantially normal functional operation, the observation points having been selected from the nodes and terminals corresponding to faults not detected by a fault simulation that causes the test target circuit to perform a substantially normal functional operation, the observation circuit comprising a plurality of flip-flops, wherein the observation circuit is controlled by the internal clock signal, the internal reset signal, and the internal operation mode signal, and is configured to reset the flip-flops in response to the internal reset signal, and to selectively perform, using the flip-flops, (a) a first operation of compressing input data from the observation points to generate a signature during substantially normal operation of the test target circuit, the input data being generated in the test target circuit in accordance with test patterns that cause the test target circuit to perform a substantially normal functional operation, and (b) a second operation of serially transferring data, to cause the flip-flops to be connected in series and to read the signature out of the observation circuit, in response to the internal operation mode signal.

2. A device according to claim 1, wherein a node or terminal selected as one of the observation points corresponds to an undetected fault obtained by the fault simulation and to a node name in circuit connection information at RT (Register Transfer) or higher level.

3. A device according to claim 1, wherein the observation points are divided into groups on the basis of periods of time necessary for data at each of the observation points to take a settled value after the external reset signal is inputted,
the observation circuit comprises observation circuits provided respectively to the groups of the observation points, and
the control circuit supplies internal reset signals respectively to the observation circuits of the groups.

4. A device according to claim 1, wherein the control circuit includes a control logic, which generates the internal reset signal, and resets the observation circuit, using a serial operation.

5. A device according to claim 1, wherein the observation circuit is arranged to forcibly cause input data from a specific one of the observation points to be invalid and to be a fixed value.

6. A device according to claim 1, wherein the observation points are respectively in synchronism with different clock signals, and are divided into groups, each of which observation points having the same clock signal belonging to one of the groups, and
the observation circuit comprises observation circuits provided respectively to the groups of the observation points, and each of the observation circuits is operated by an internal clock signal that is the same as a clock signal with which a corresponding one of the groups of the observation points is in synchronism.

7. A device according to claim 6, wherein at least one of the observation points is connected to one of the observation circuits, which is operated in synchronism with an internal clock signal different from a clock signal with which said at least one of the observation points is in synchronism.

8. A device according to claim 1, wherein data at each of the observation points is selectively inputted into the observation circuit in accordance with the test pattern.

9. A device according to claim 1, wherein the observation circuit comprises:
the flip-flops provided in association with the observation points;
a first XOR gate circuit configured to subject outputs of predetermined ones of the flip-flops to an exclusive OR operation;

a multiplexer configured to subject a serial input data and an output of the first XOR gate circuit to a selection operation on the basis of the internal operation mode signal;

a plurality of AND gates disposed respectively to the flip-flops, and configured to subject respective outputs of the observation points and the internal operation mode signal to an AND operation; and a plurality of second XOR gates disposed respectively to the flip-flops, and configured to subject respective outputs of the AND gates and respective specific outputs to an exclusive OR operation, the specific output of a first stage one of the second XOR gates being an output of the multiplexer, and the specific output of the other of the second XOR gates being an output of a former stage one of the flip-flops.

10. A device according to claim 9, further comprising a gate configured to selectively output one of a signal, which forcibly causes input data from a corresponding one of the observation points to be invalid, and the internal operation mode signal, to a specific one of the AND gates.

11. A device according to claim 1, wherein the internal reset signal is generated as part of the internal operation mode signal.

* * * * *